(12) United States Patent
Wang

(10) Patent No.: US 8,441,101 B2
(45) Date of Patent: May 14, 2013

(54) SEMICONDUCTOR DEVICE AND METHOD FOR MANUFACTURING THE SAME

(75) Inventor: Wensheng Wang, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/106,286

(22) Filed: May 12, 2011

(65) Prior Publication Data

US 2011/0210424 A1 Sep. 1, 2011

Related U.S. Application Data

(60) Division of application No. 11/949,387, filed on Dec. 3, 2007, now abandoned, which is a continuation of application No. PCT/JP2005/010188, filed on Jun. 2, 2005.

(51) Int. Cl.
*H01L 21/02* (2006.01)

(52) U.S. Cl.
USPC ........................................ 257/532; 257/528

(58) Field of Classification Search ........... 257/E27.104, 257/295, 532, 528
See application file for complete search history.

(56) References Cited

U.S. PATENT DOCUMENTS

| | | | |
|---|---|---|---|
| 6,172,385 B1 | 1/2001 | Duncombe et al. | |
| 6,485,988 B2 | 11/2002 | Ma et al. | |
| 6,611,014 B1 | 8/2003 | Kanaya et al. | |
| 6,635,528 B2 | 10/2003 | Gilbert et al. | |
| 6,673,672 B2 | 1/2004 | Sashida | |
| 6,770,905 B1 * | 8/2004 | Buynoski et al. | 257/40 |
| 2001/0044205 A1 | 11/2001 | Gilbert et al. | |
| 2002/0001971 A1 | 1/2002 | Cho | |
| 2002/0006674 A1 | 1/2002 | Ma et al. | |
| 2002/0038402 A1 | 3/2002 | Kanaya | |
| 2002/0074588 A1 * | 6/2002 | Lee | 257/306 |
| 2003/0071293 A1 | 4/2003 | Otani et al. | |
| 2003/0080338 A1 * | 5/2003 | Yamazaki et al. | 257/59 |
| 2003/0098497 A1 | 5/2003 | Solayappan et al. | |
| 2004/0046185 A1 * | 3/2004 | Sashida | 257/200 |
| 2004/0084701 A1 | 5/2004 | Kanaya et al. | |

(Continued)

FOREIGN PATENT DOCUMENTS

| | | |
|---|---|---|
| JP | 2001-36026 A | 2/2001 |
| JP | 2001-111007 A | 4/2001 |

(Continued)

OTHER PUBLICATIONS

Supplementary European Search Report date Jun. 28, 2010, issued in corresponding European Patent Application No. 05745753.3.

(Continued)

*Primary Examiner* — N Drew Richards
*Assistant Examiner* — Yu-Hsi D Sun
(74) *Attorney, Agent, or Firm* — Westerman, Hattori, Daniels & Adrian, LLP

(57) ABSTRACT

Ferroelectric capacitors (42) are formed over a semiconductor substrate (10), then, a barrier film (46) directly covering the ferroelectric capacitors (42) is formed. Thereafter, wirings (56a etc.) connected to the ferroelectric capacitors (42) are formed. Further, a barrier film (58) is formed at a position higher than the wirings (56a etc.). In forming the barrier film (46), a film stack is formed, the film stack including at least two kinds of diffusion preventive films (46a and 46b) having different components and preventing diffusion of hydrogen or water.

4 Claims, 28 Drawing Sheets

U.S. PATENT DOCUMENTS

| | | | |
|---|---|---|---|
| 2004/0159874 | A1 | 8/2004 | Tsuchiya et al. |
| 2004/0173829 | A1 | 9/2004 | Kim |
| 2004/0185634 | A1 | 9/2004 | Lim et al. |
| 2005/0019960 | A1 | 1/2005 | Lee et al. |
| 2005/0212020 | A1 | 9/2005 | Izumi et al. |
| 2008/0105911 | A1 | 5/2008 | Wang |
| 2009/0160023 | A1 | 6/2009 | Izumi et al. |
| 2011/0012230 | A1 | 1/2011 | Izumi et al. |

FOREIGN PATENT DOCUMENTS

| | | | |
|---|---|---|---|
| JP | 2002-93797 A | 3/2002 | |
| JP | 2002-176149 A | 6/2002 | |
| JP | 2004-071932 A | 3/2004 | |
| JP | 2004-274048 A | 9/2004 | |
| JP | 2005-026482 A | 1/2005 | |
| JP | 2005-045271 A | 2/2005 | |
| KR | 2005-13082 A | 2/2005 | |
| WO | 2004/095578 A1 | 11/2004 | |

OTHER PUBLICATIONS

European Search Report dated Jan. 27, 2011, issued in corresponding European Application No. 10179525.

Chinese Office Action dated Jun. 5, 2009, issued in corresponding Chinese Patent Application No. 200580049945.1.

International Search Report of PCT/JP2005/010188, date of mailing Jul. 12, 2005.

Korean Office Action dated Apr. 29, 2009, issued in corresponding Korean Patent Application No. 10-2007-7027207.

Notification of Transmittal of Translation of the International Preliminary Report on Patentability (Form PCT/IB/338) of International Application No. PCT/JP2005/010188 mailed Dec. 21, 2007.

U.S. Office Action dated Feb. 3, 2009 issued in parent U.S. Appl. No. 11/949,387.

U.S. Office Action dated May 27, 2009 issued in parent U.S. Appl. No. 11/949,387.

U.S. Office Action dated Jan. 25, 2010 issued in parent U.S. Appl. No. 11/949,387.

U.S. Office Action dated May 11, 2010 issued in parent U.S. Appl. No. 11/949,387.

U.S. Office Action dated Jan. 19, 2011 issued in parent U.S. Appl. No. 11/949,387.

Japanese Office Action mailed Apr. 24, 2012, issued in corresponding Japanese Patent Application No. 2007-518838, w/ partial English translation.

* cited by examiner

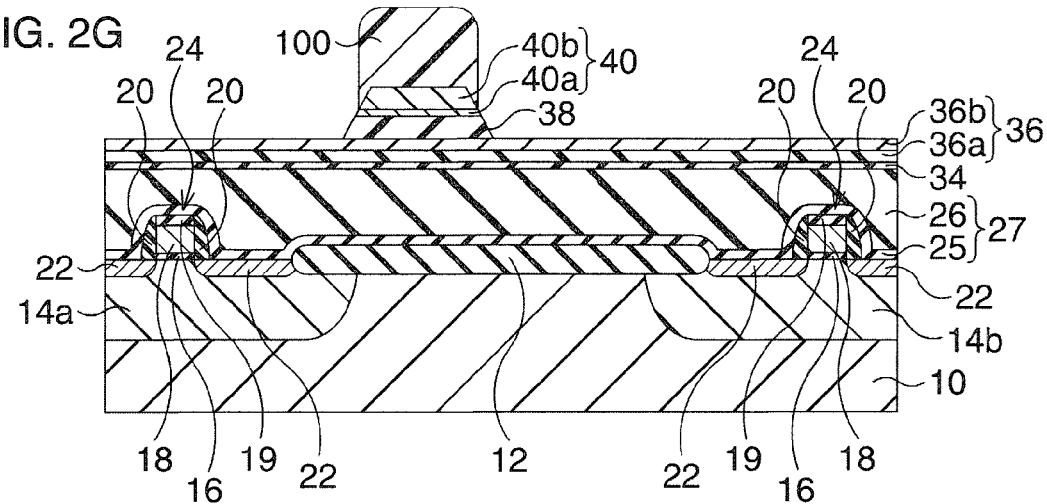
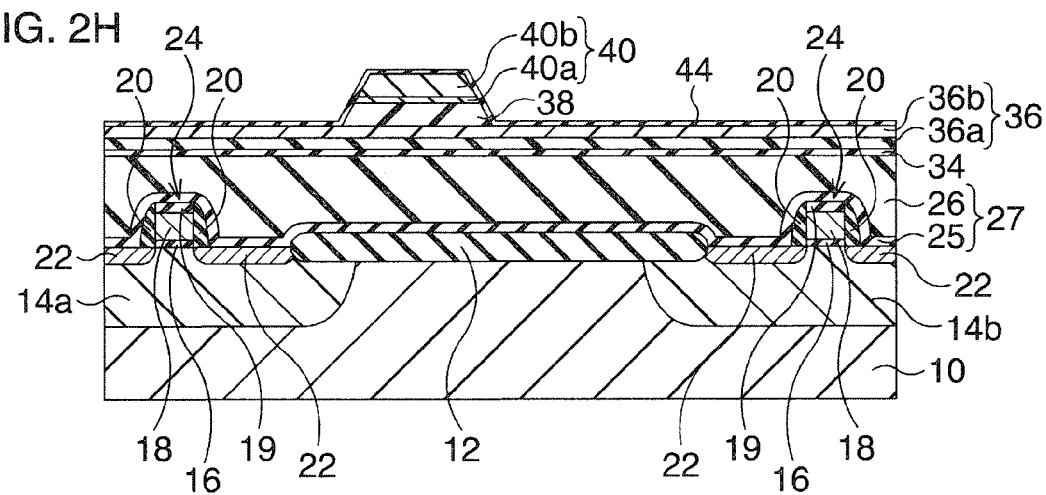
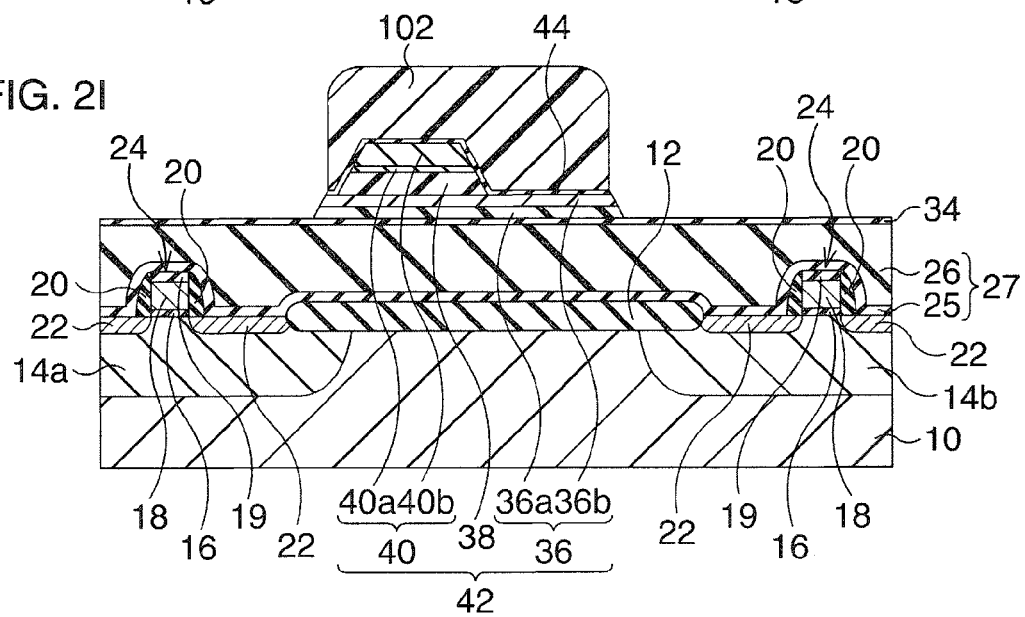

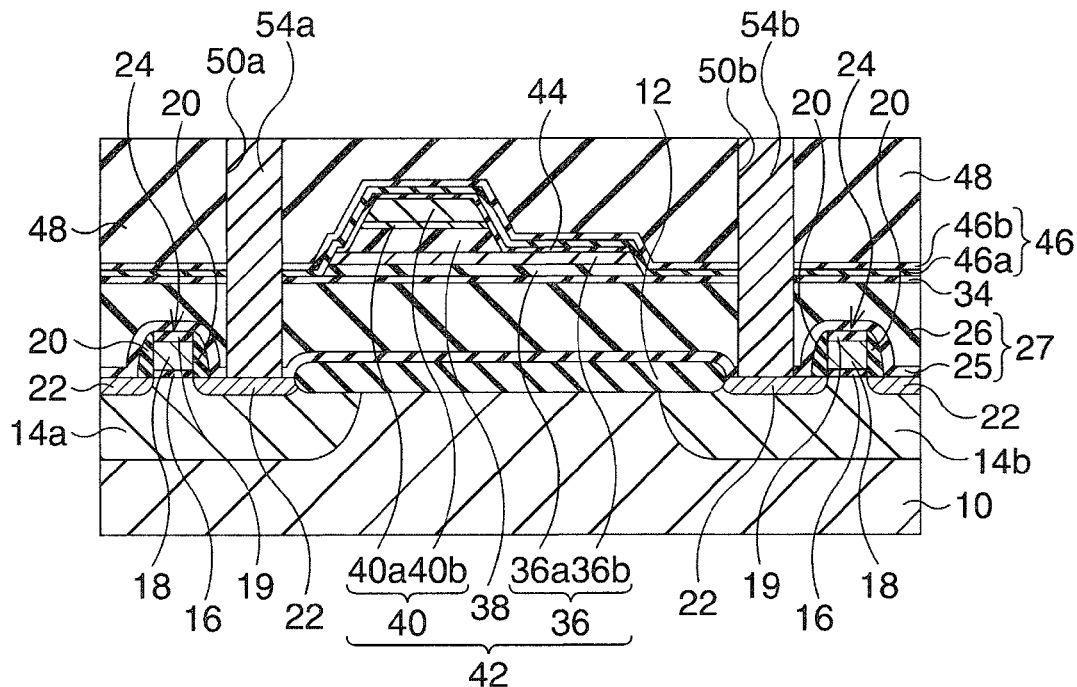
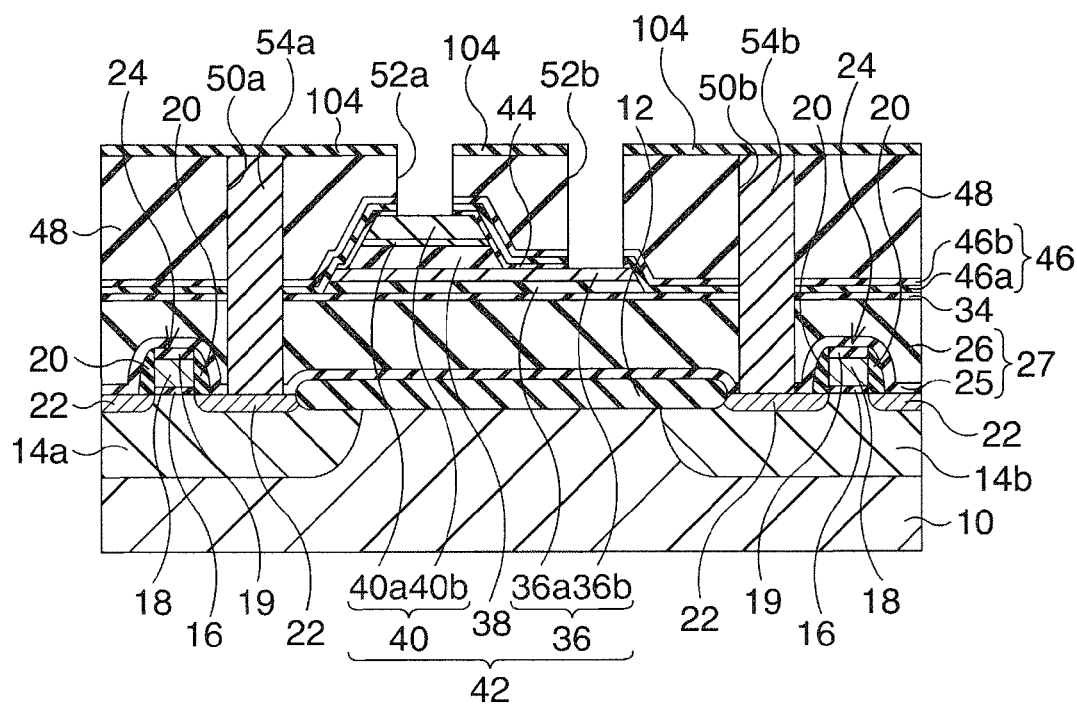

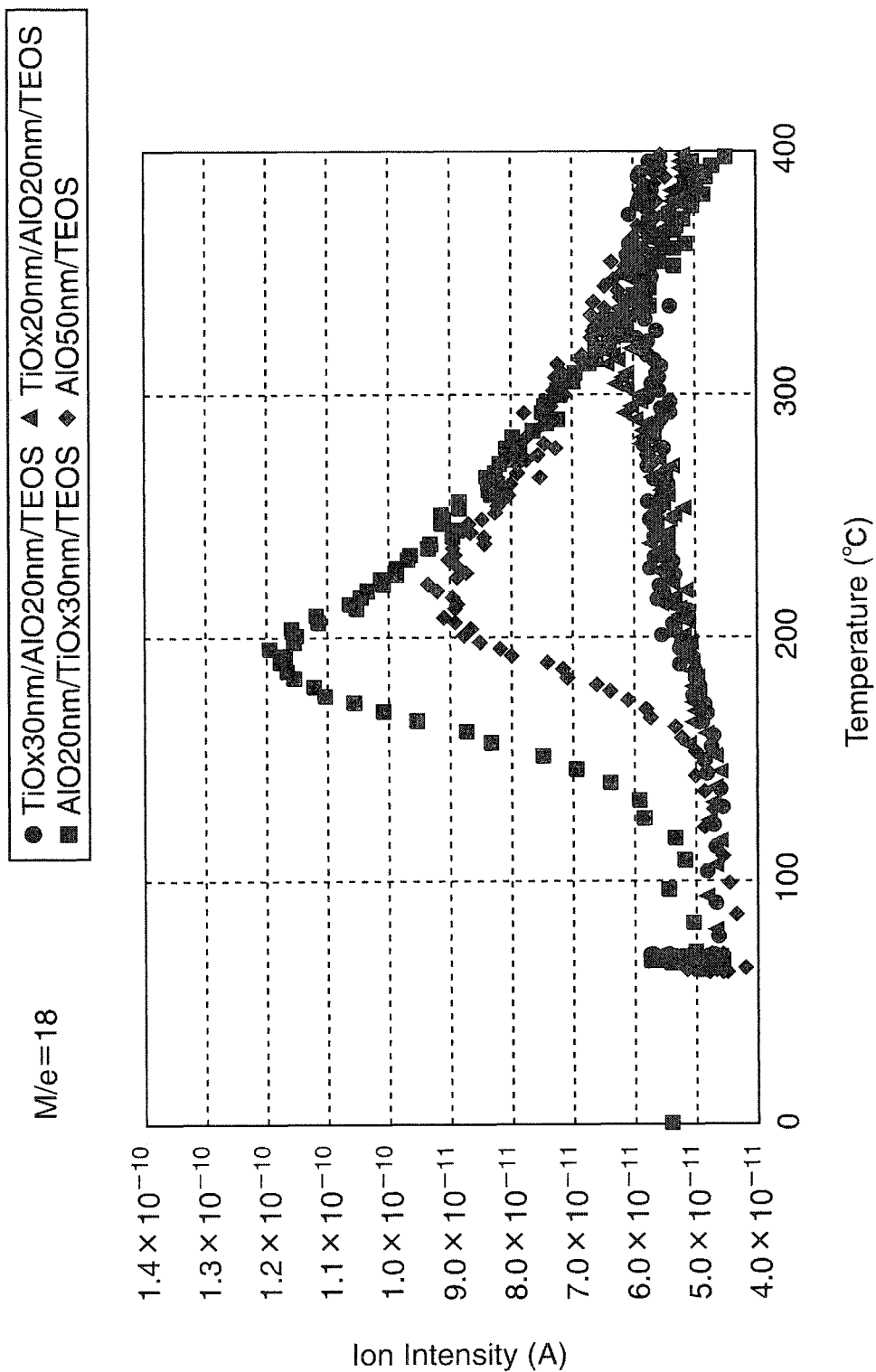

SEMICONDUCTOR DEVICE AND METHOD FOR MANUFACTURING THE SAME

CROSS-REFERENCE TO RELATED APPLICATION

This application is a divisional application of U.S. patent application Ser. No. 11/949,387 filed on Dec. 3, 2007, which is a continuation of an International Application PCT/JP2005/01088, filed Jun. 2, 2005, which is hereby incorporated by reference in its entirety.

TECHNICAL FIELD

The embodiments discussed herein are directed to a semiconductor device suitable for a nonvolatile memory including a ferroelectric capacitor and a method for manufacturing the same.

BACKGROUND ART

In accordance with the progress of digital technology, recent years have seen an increasing tendency for high-speed processing or storage of a large volume of data. This is creating a demand for higher integration and higher performance of a semiconductor device used for electronic apparatuses.

Under such circumstances, in order to realize higher integration of a semiconductor memory device (DRAM), many researches and developments are underway on a technique to use a ferroelectric material or a high-dielectric constant material, in place of a silicon oxide or a silicon nitride, in forming a capacitor insulating film of a capacitor element constituting a DRAM.

Further, in order to realize a nonvolatile RAM capable of high-speed writing operation and reading operation with low voltage, also under active research and development is a ferroelectric memory (FeRAM) using, as a capacitor insulating film, a ferroelectric film having a spontaneous polarization characteristic.

A ferroelectric memory stores data by utilizing a hysteresis characteristic of a ferroelectric. In the ferroelectric memory, a ferroelectric capacitor having a ferroelectric film as a capacitor dielectric film formed between a pair of electrodes is provided in each memory cell. In a ferroelectric, polarization occurs according to voltage applied between the electrodes, and spontaneous polarization remains even if the applied voltage is removed. Further, polarity inversion of the applied voltage results in polarity inversion of the spontaneous polarization. Therefore, by detecting the spontaneous polarization, it is possible to read data. The ferroelectric memory has characteristics of high-speed operation, low power consumption, excellent read/write durability, and so on.

However, to design and manufacture a ferroelectric memory, it is necessary to overcome the property that an electric characteristic of its ferroelectric capacitors is easily deteriorated by hydrogen gas and moisture entering from an external part. In a conventional ferroelectric capacitor which includes a bottom electrode composed of a Pt film, a ferroelectric film composed of a $PbZr_{1-x}Ti_xO_3$ (PZT) film, and a top electrode composed of a Pt film, if a substrate is heated to about 200° C. in an atmosphere of an about 40 Pa (0.3 Torr) hydrogen partial pressure, the ferroelectric characteristic of the $PbZr_{1-x}Ti_xO_3$ film is almost completely lost. Moreover, if the thermal treatment is applied in a state where the ferroelectric capacitor adsorbs moisture or in a state where moisture exists near the ferroelectric capacitor, the ferroelectric characteristic of the ferroelectric film greatly deteriorates.

Under such circumstances, in manufacturing a ferroelectric memory, processing that generates as little moisture as possible and can be conducted at as low temperature as possible is selected after the ferroelectric film is formed. In particular, in forming an interlayer insulating film, a CVD (Chemical Vapor Deposition) method or the like using source gas generating a relatively small amount of hydrogen is selected.

Further, there have been proposed a structure including a barrier film covering a ferroelectric capacitor and a structure including a barrier film formed above a ferroelectric capacitor. As the barrier film, an aluminum oxide film is mainly used. This is because the aluminum oxide film has a function of preventing diffusion of hydrogen and moisture.

However, it is difficult to form contact holes in a desired shape passing through the aluminum oxide film. This is because the aluminum oxide film little reacts with etching gas and thus sputtering etching is required. Reducing the thickness of the aluminum oxide film enables an increase in processing accuracy, but cannot ensure a sufficient barrier effect due to relatively low coverage of the aluminum oxide film.

Patent document 1: Japanese Patent Application Laid-open No. 2002-176149
Patent document 2: Japanese Patent Application Laid-open No. 2004-71932
Patent document 3: Japanese Patent Application Laid-open No. 2001-111007

SUMMARY

It is an aspect of the embodiments discussed herein to provide a semiconductor device including a ferroelectric capacitor formed over a semiconductor substrate, and a barrier film covering the ferroelectric capacitor, wherein the barrier film is a film stack whose lower layer is one kind of film selected from a group consisting of an aluminum oxide film, an aluminum nitride film, and an aluminum oxynitride film, and whose upper layer is one kind of film selected from a group consisting of a titanium oxide film, a tantalum oxide film, a zirconium oxide film, and a tantalum nitride film.

BRIEF DESCRIPTION OF THE DRAWINGS

FIG. 2G is a cross-sectional view showing the method for manufacturing a ferroelectric memory, in order of processes, following FIG. 2F;

FIG. 2H is a cross-sectional view showing the method for manufacturing a ferroelectric memory, in order of processes, following FIG. 2G;

FIG. 2I is a cross-sectional view showing the method for manufacturing a ferroelectric memory, in order of processes, following FIG. 2H;

FIG. 2N is a cross-sectional view showing the method for manufacturing a ferroelectric memory, in order of processes, following FIG. 2M;

FIG. 2O is a cross-sectional view showing the method for manufacturing a ferroelectric memory, in order of processes, following FIG. 2N;

FIG. 14B is a graph showing results of TDS analysis of a substance ($H_2O$) whose molecular weight is 18, in the art described in the patent document 3.

DETAILED DESCRIPTION OF THE PREFERRED EMBODIMENTS

Figure 1:
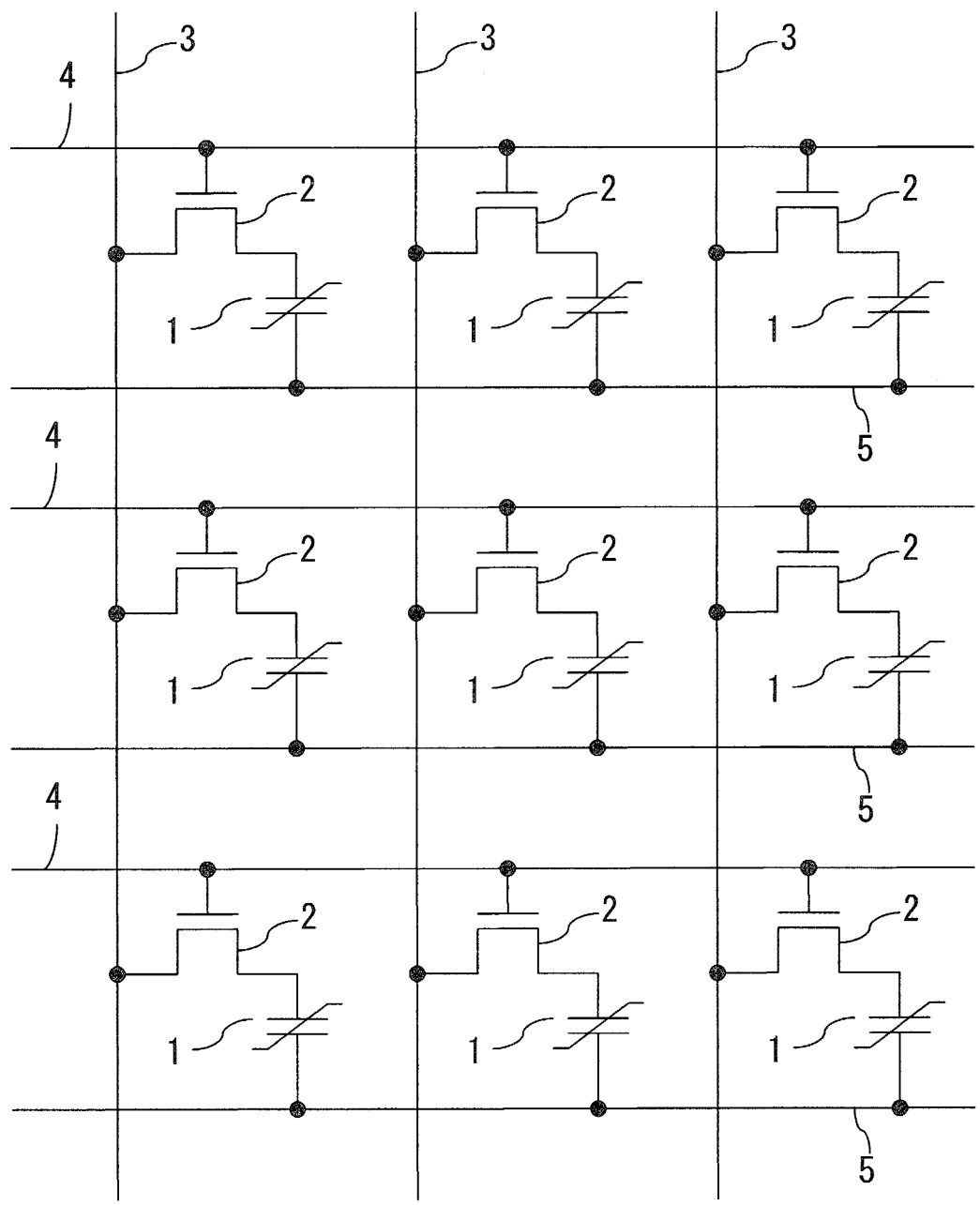
FIG. 1 is a circuit diagram showing the configuration of a memory cell array of a ferroelectric memory (semiconductor device) manufactured by a method according to an embodiment.

Hereinafter, embodiments will be concretely described with reference to the accompanying drawings. FIG. 1 is a circuit diagram showing the configuration of a memory cell array of a ferroelectric memory (semiconductor device) manufactured by a method according to an embodiment.

A plurality of bit lines 3 extending in one direction, and a plurality of word lines 4 and plate lines 5 extending in a direction perpendicular to the direction in which the bit lines 3 extend are provided to the memory cell array. Further, a plurality of memory cells of the ferroelectric memory are arranged in arrays so as to match spaces in a lattice formed by these bit lines 3, word lines 4, and plate lines 5. Each of the memory cells has a ferroelectric capacitor (storage part) 1 and a MOS transistor (switching part) 2.

A gate of the MOS transistor 2 is connected to the word line 4. One source/drain of the MOS transistor 2 is connected to the bit line 3 and the other source/drain is connected to one of electrodes of the ferroelectric capacitor 1. The other electrode of the ferroelectric capacitor 1 is connected to the plate line 5. Each of the word lines 4 and each of the plate lines 5 are shared by the plural MOS transistors 2 arranged in the same direction as the direction in which the word lines 4 and the plate lines 5 extend. Similarly, each of the bit lines 3 is shared by the plural MOS transistors 2 arranged in the same direction as the direction in which the bit lines 3 extend. The direction in which the word lines 4 and the plate lines 5 extend and the direction in which the bit lines 3 extend are sometimes called a row direction and a column direction respectively. However, the arrangement of the bit lines 3, the word lines 4, and the plate lines 5 is not limited to that described above.

In the memory cell array of the ferroelectric memory as configured above, data is stored according to polarization states of ferroelectric films provided in the ferroelectric capacitors 1.

(First Embodiment)

Figure 2A:
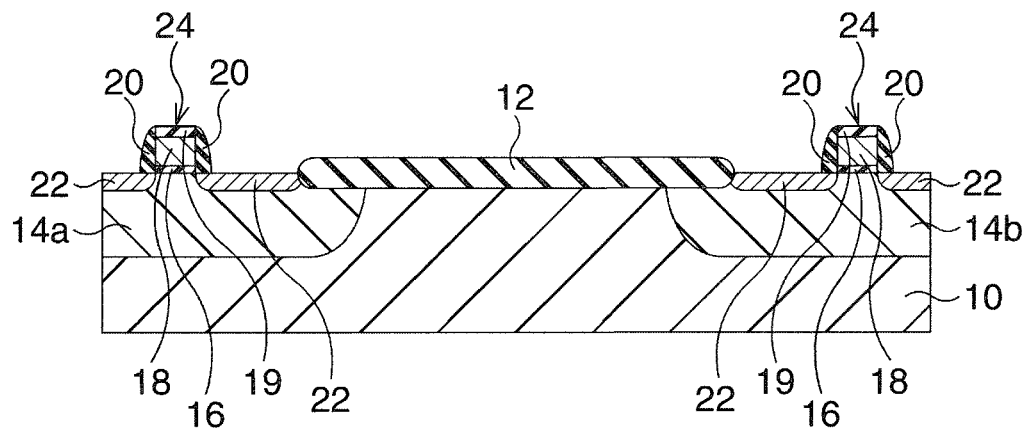
FIG. 2A is a cross-sectional view showing a method for manufacturing a ferroelectric memory according to a first embodiment, in order of processes.

Next, a first embodiment will be described. Here, for convenience sake, a cross-sectional structure of a semiconductor device will be described along with its manufacturing method. FIG. 2A to FIG. 2U are cross-sectional views showing a method for manufacturing a ferroelectric memory (semiconductor memory) according to the first embodiment, in order of processes.

First, as shown in FIG. 2A, element isolation regions 12 defining element regions are formed on a semiconductor substrate 10 such as a silicon substrate by, for example, a LOCOS (Local Oxidation of Silicon) method. Then, dopant impurities are introduced by an ion implantation method, thereby forming wells 14a and 14b. Next, transistors 24 each including a gate insulating film 16, a gate electrode (gate wiring) 18, an insulating film 19, a sidewall insulating film 20, and source/drain diffusion layers 22 are formed in the element regions. The transistors 24 correspond to the MOS transistors 2 in FIG. 1.

Figure 2B:
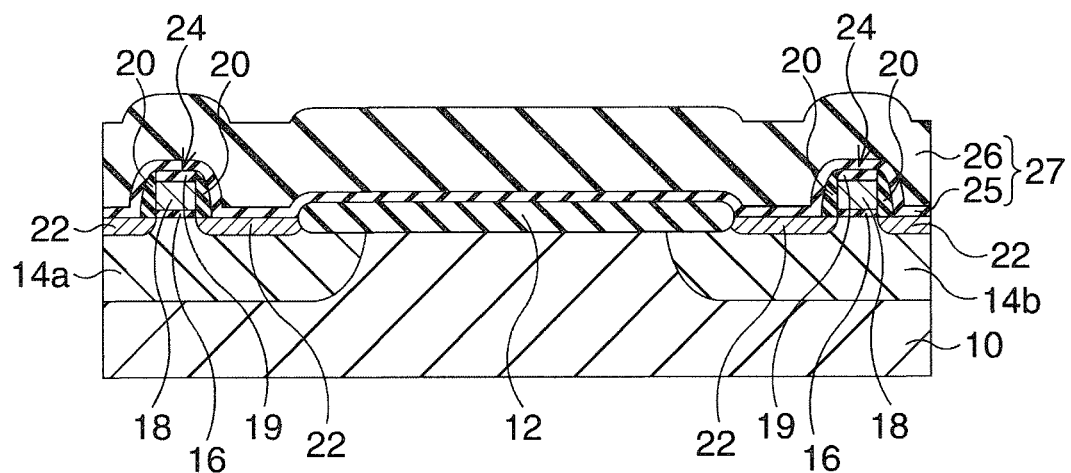
FIG. 2B is a cross-sectional view showing the method for manufacturing a ferroelectric memory, in order of processes, following FIG. 2A.

Next, as shown in FIG. 2B, a SiON film 25 having a thickness of, for example, 200 nm is formed on the entire surface by, for example, a plasma CVD (Chemical Vapor Deposition) method. Further, a silicon oxide film 26 having a thickness of, for example, 600 nm is formed on the entire surface by a plasma TEOSCVD method. The SiON film 25 and the silicon oxide film 26 constitute an interlayer insulating film 27.

Figure 2C:
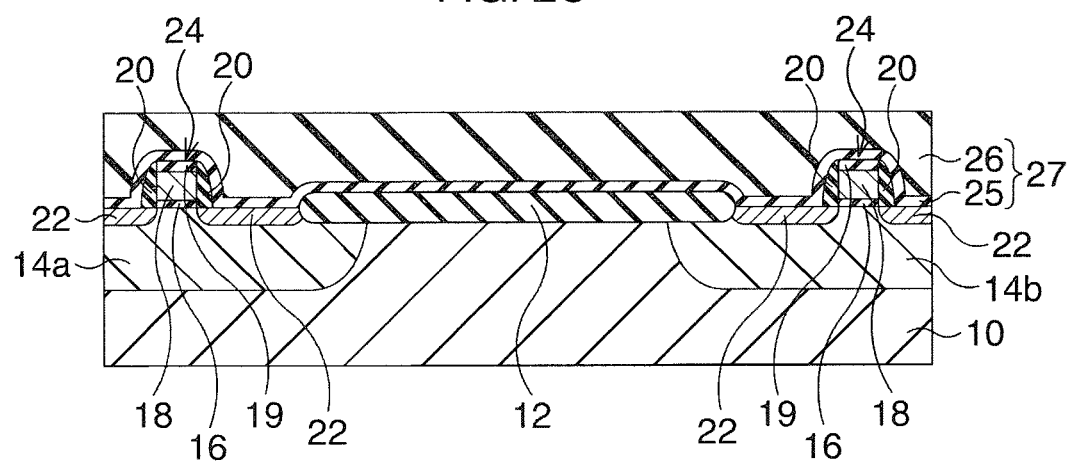
FIG. 2C is a cross-sectional view showing the method for manufacturing a ferroelectric memory, in order of processes, following FIG. 2B.

Next, as shown in FIG. 2C, a surface of the interlayer insulating film 27 is planarized by, for example, a CMP method. Then, thermal treatment in an atmosphere of dinitrogen monoxide ($N_2O$) or nitrogen ($N_2$) is performed, for example, at 650° C. for 30 minutes.

Figure 2D:
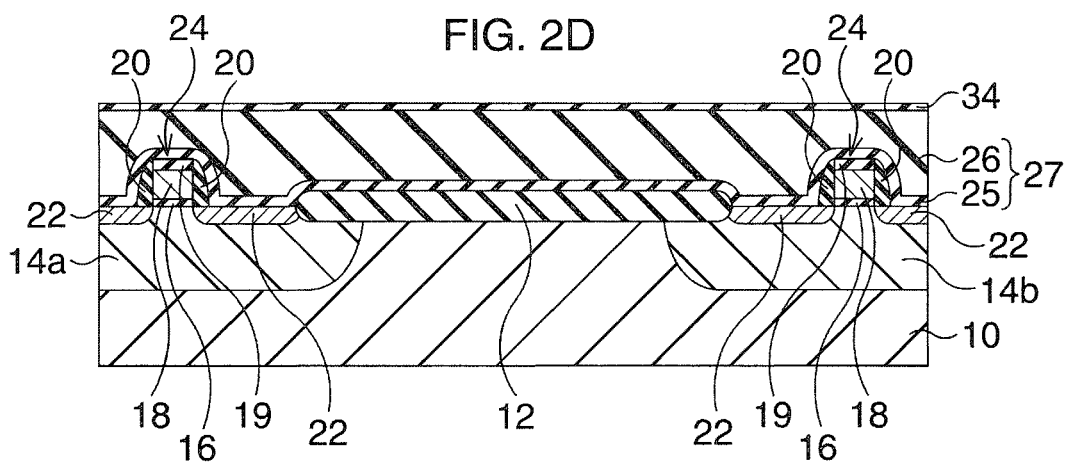
FIG. 2D is a cross-sectional view showing the method for manufacturing a ferroelectric memory, in order of processes, following FIG. 2C.

Next, as shown in FIG. 2D, a silicon oxide film 34 having a thickness of, for example, 100 nm is formed on the entire surface by, for example, a plasma TEOSCVD method. As a result, the surface becomes flatter. Then, thermal treatment in an atmosphere of plasma generated by using $N_2O$ gas is performed, for example, at 350° C. for two minutes. As a result, a surface of the silicon oxide film 34 is slightly nitrided, which makes the silicon oxide film 34 difficult to absorb moisture.

Figure 2E:
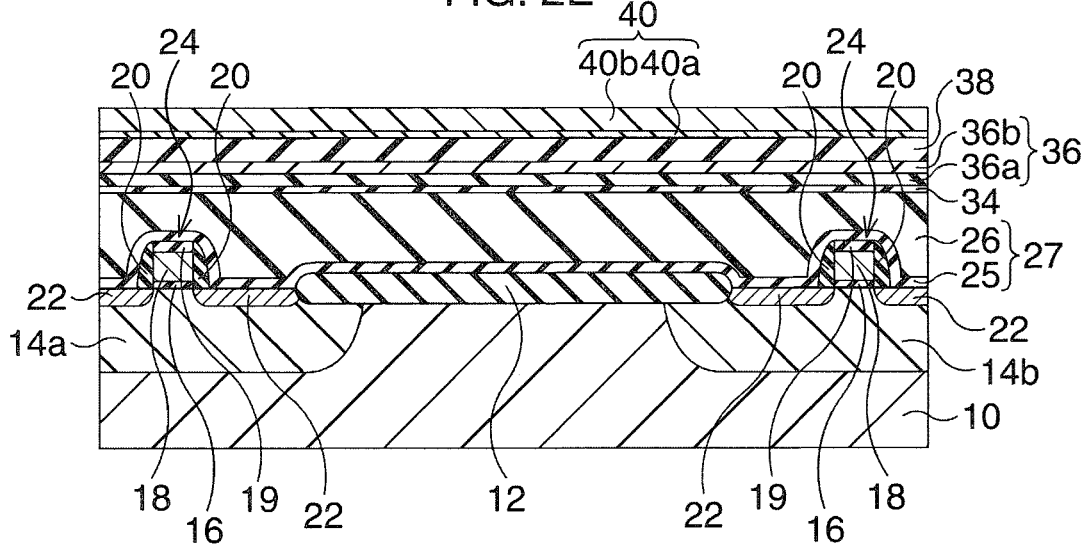
FIG. 2E is a cross-sectional view showing the method for manufacturing a ferroelectric memory, in order of processes, following FIG. 2D.

Next, as shown in FIG. 2E, an aluminum oxide film 36a having a thickness of, for example, 20 nm to 50 nm is formed on the entire surface by, for example, a sputtering method or a CVD method. Then, there follows thermal treatment in an oxygen atmosphere by, for example, a RTA (Rapid Thermal Annealing) method. The thermal treatment temperature is, for example, 650° C. and the thermal treatment time is, for example, one minute to two minutes. Next, a Pt film 36b having a thickness of, for example, 100 nm to 200 nm is formed as a bottom electrode film on the entire surface by, for example, a sputtering method. The aluminum oxide film 36a and the Pt film 36b constitute a ferroelectric capacitor multilayer film 36.

Next, as shown in FIG. 2E again, a ferroelectric film 38 is formed on the entire surface by, for example, a sputtering method. As the ferroelectric film 38, a PZT film having a thickness of, for example, 100 nm to 250 nm is formed. It should be noted that the method for forming the ferroelectric film 38 is not limited to the sputtering method. For example, the ferroelectric film 38 may be formed by a sol-gel method, a MOD (Metal Organic Decomposition) method, a MOCVD method, or the like.

Then, there follows thermal treatment in an oxygen atmosphere by, for example, a RTA method. The thermal treatment temperature is, for example, 550° C. to 600° C., and the thermal treatment time is, for example, 60 seconds to 120 seconds. Next, as shown also in FIG. 2E, an $IrO_x$ film 40a having a thickness of, for example, 25 nm to 75 nm is formed by, for example, a sputtering method or a MOCVD method. Then, thermal treatment in an atmosphere of argon and oxygen is performed, for example, at 600° C. to 800° C. for 10 seconds to 100 seconds. As a result, a ferroelectric material forming the ferroelectric film 38 is completely crystallized and an interface between the ferroelectric film 38 and the $IrO_x$ film 40a becomes flat. Next, an $IrO_y$ film 40b having a thickness of, for example 150 nm to 250 nm is formed by, for example, a sputtering method or a MOCVD method. At this time, in order to reduce process deterioration, a composition ratio Y of oxygen of the $IrO_y$ film 40b is made higher than a composition ratio X of oxygen of the $IrO_x$ film 40a. The $IrO_x$ film 40a and the $IrO_y$ film 40b constitute a top electrode film 40.

Figure 2F:
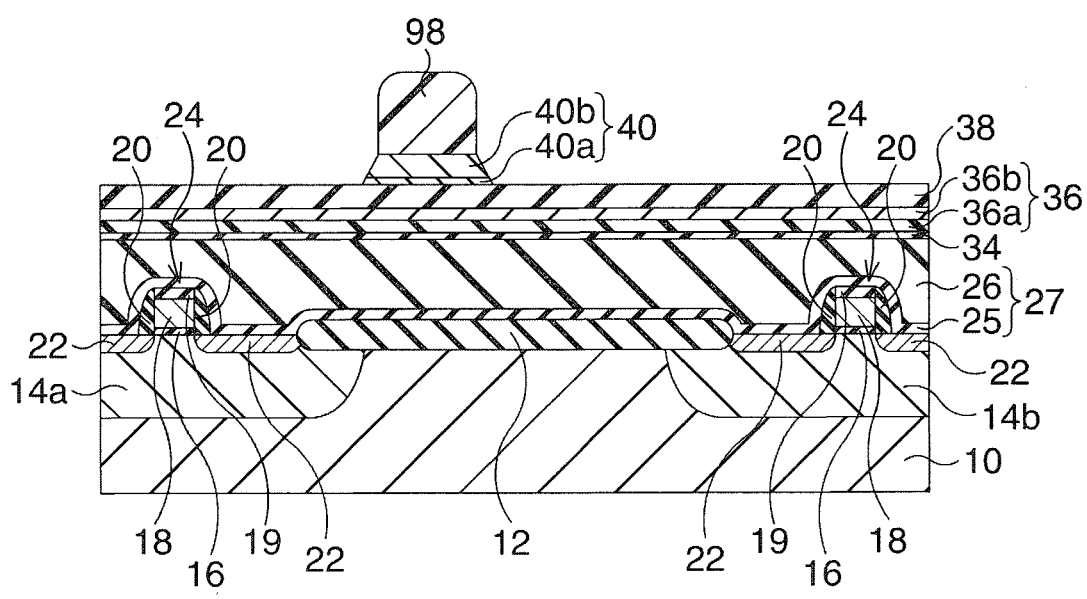
FIG. 2F is a cross-sectional view showing the method for manufacturing a ferroelectric memory, in order of processes, following FIG. 2E.

Next, as shown in FIG. 2F, a photoresist film 98 is formed on the entire surface by, for example, a spin coating method, and the photoresist film 98 is patterned into the same shape as a planar shape of top electrodes of the ferroelectric capacitors by photolithography. Subsequently, the top electrode film 40 is etched. As etching gas, Ar gas and $Cl_2$ gas are used, for instance. Thereafter, the photoresist film 98 is removed. Then, thermal treatment in, for example, an oxygen atmosphere is performed, for example, at 400° C. to 700° C. for 30 minutes to 120 minutes. This thermal treatment is intended for preventing the occurrence of abnormality on surfaces of the top electrodes (the patterned top electrode film 40).

Next, as shown in FIG. 2G, a photoresist film 100 is formed on the entire surface by, for example, a spin coating method, and the photoresist film 100 is patterned into a planar shape of capacitor insulating films by photolithography. Subsequently, the ferroelectric film 38 is etched. Thereafter, the photoresist film 100 is removed. Then, thermal treatment in an oxygen atmosphere is performed, for example, at 300° C. to 400° C. for 30 minutes to 120 minutes.

Next, as shown in FIG. 2H, a barrier film 44 is formed by, for example, a sputtering method or a CVD method. As the barrier film 44, an aluminum oxide film having a thickness of, for example, 20 nm to 50 nm is formed. Then, thermal treatment in an oxygen atmosphere is performed, for example, at 400° C. to 600° C. for 30 minutes to 120 minutes.

Next, as shown in FIG. 2I, a photoresist film 102 is formed on the entire surface by, for example, a spin coating method, and the photoresist film 102 is patterned into a planar shape of bottom electrodes of the ferroelectric capacitors by photolithography. Subsequently, the barrier film 44 and the bottom electrode film 36 are etched. As a result, the bottom electrodes are formed. The patterned top electrode film 40, ferroelectric film 38, and bottom electrode film 36 constitute each of the ferroelectric capacitors 42, and the ferroelectric capacitors 42 correspond to the ferroelectric capacitors 1 shown in FIG. 1. The barrier film 44 is left so as to cover the top electrode film 40 and the ferroelectric film 38. Thereafter, the photoresist film 102 is removed. Then, thermal treatment in an oxygen atmosphere is performed, for example, at 400° C. to 600° C. for 30 minutes 120 minutes.

Figure 2J:
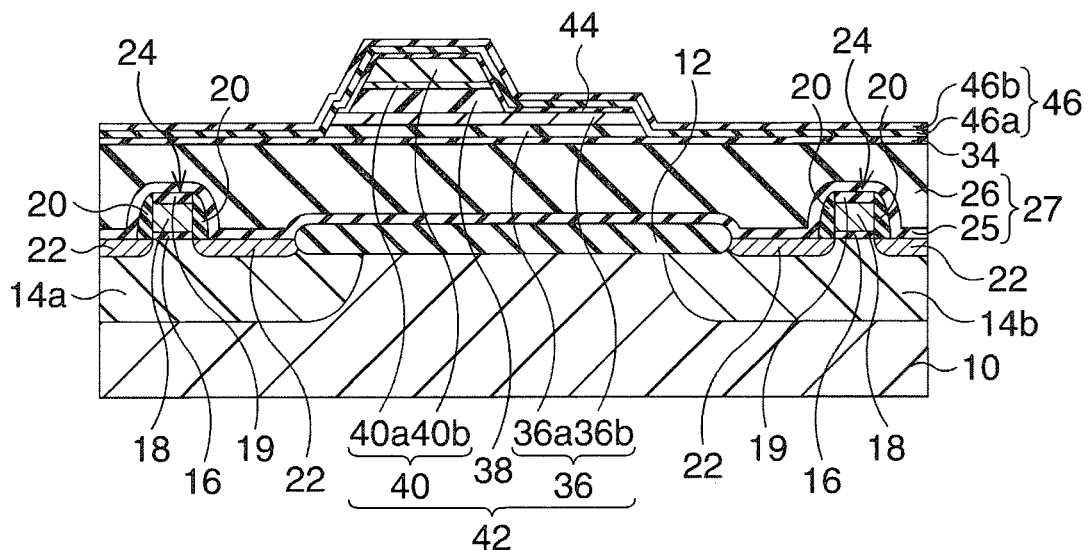
FIG. 2J is a cross-sectional view showing the method for manufacturing a ferroelectric memory, in order of processes, following FIG. 2I.
Figure 3A:
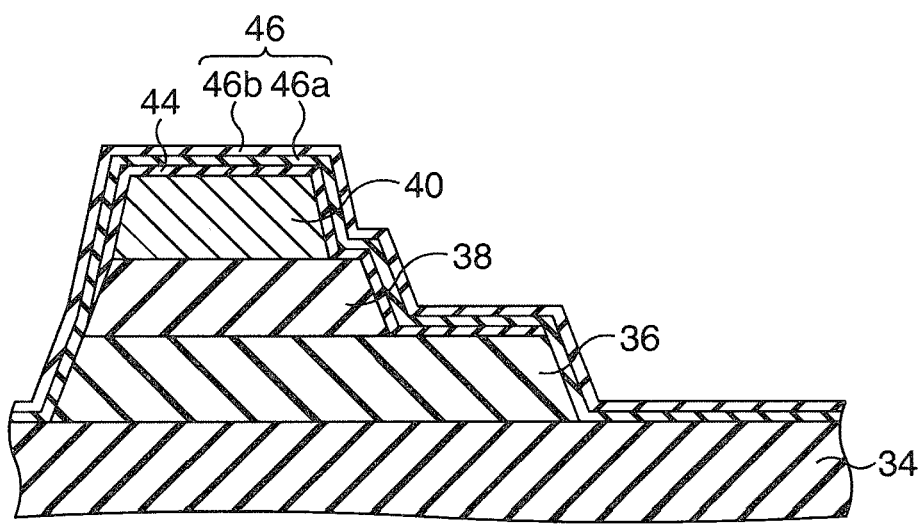
FIG. 3A is a cross-sectional view showing a method for forming a barrier film 46.

Next, as shown in FIG. 2J, a barrier film 46 is formed on the entire surface by, for example, a sputtering method or a CVD method. In this embodiment, in forming the barrier film 46, an aluminum oxide film 46a having a thickness of, for example, 20 nm is first formed by, for example, a sputtering method or a CVD method as shown in FIG. 3A. Next, a titanium oxide film 46b having a thickness of, for example, 20 nm to 30 nm is formed on the aluminum oxide film 46a by, for example, a sputtering method or a CVD method.

Figure 3B:
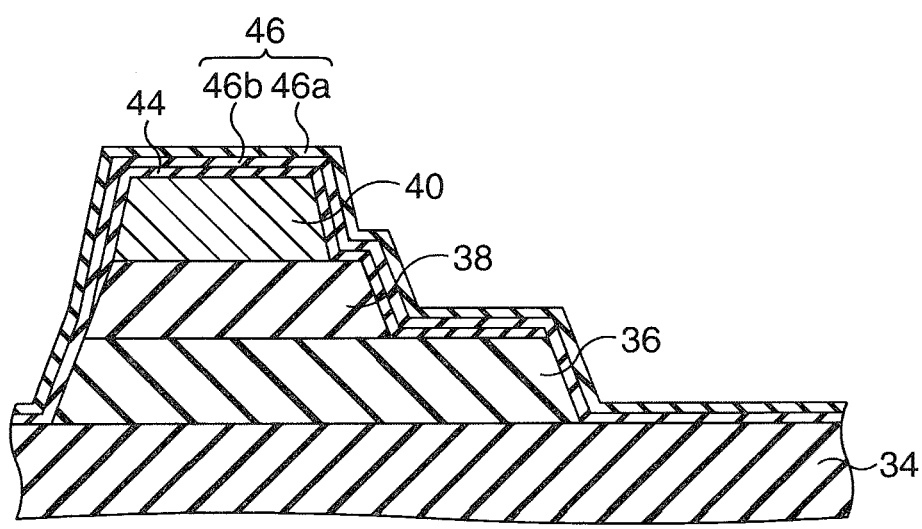
FIG. 3B is a cross-sectional view showing another method for forming the barrier film 46.

Incidentally, another possible method for forming the barrier film 46 is to form the titanium oxide film 46b having a thickness of, for example, 20 nm to 30 nm and then form the aluminum oxide film 46a having a thickness of, for example, 20 nm on the titanium oxide film 46b, as shown in FIG. 3B.

Further, whichever of the aluminum oxide film 46a or the titanium oxide film 46b is first formed, thermal treatment in an oxygen-containing atmosphere is preferably performed, for example, at 300° C. to 800° C. (preferably, 500° C. to 700° C.) for 30 minutes to 120 minutes, before the formation of the film formed later (the titanium oxide film 46b or the aluminum oxide film 46a). Examples of the oxygen-containing atmosphere are an atmosphere containing only oxygen, an atmosphere containing argon and oxygen, and an atmosphere containing nitrogen and oxygen.

Further, in forming the titanium oxide film 46b, after a metallic titanium film is formed by a sputtering method, the metallic titanium film may be oxidized by annealing in an oxygen atmosphere, for example, at 300° C. to 700° C. for one minute to 120 minutes. For example, a RTA method can be used for short annealing, and for example, a generally used vertical or horizontal furnace can be used for long annealing.

After the barrier film 46 is formed, thermal treatment in an oxygen atmosphere is performed, for example, at 500° C. to 700° C. for 30 minutes to 120 minutes. As a result, oxygen is supplied to the ferroelectric film 38, so that an electric characteristic of the ferroelectric capacitors 42 is recovered.

Figure 2K:
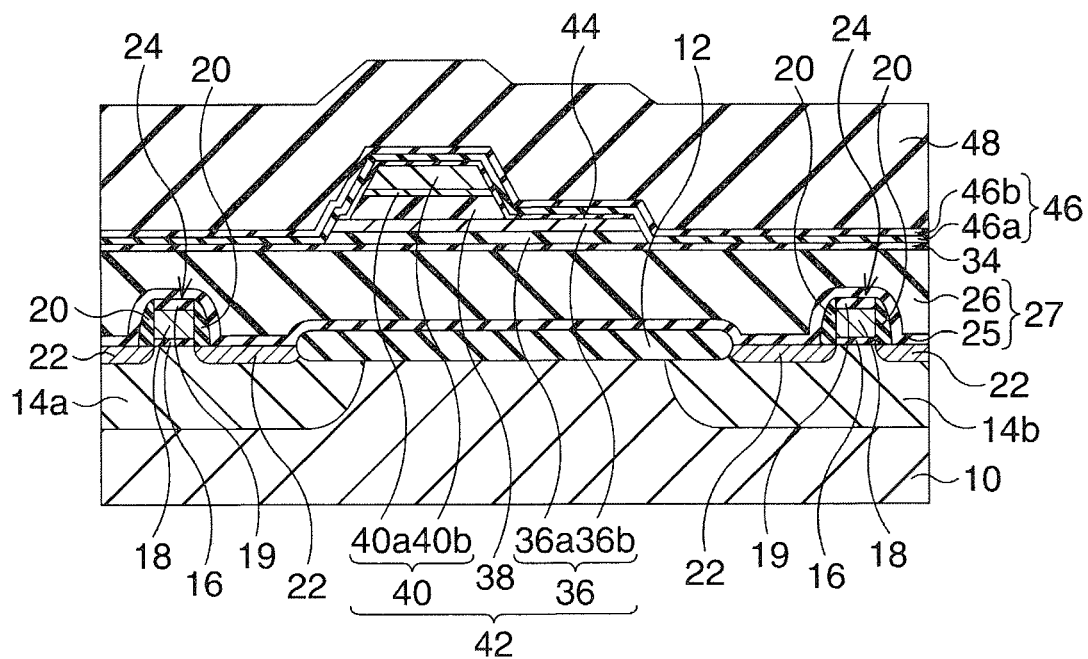
FIG. 2K is a cross-sectional view showing the method for manufacturing a ferroelectric memory, in order of processes, following FIG. 2J.

Next, as shown in FIG. 2K, an interlayer insulating film 48 having a thickness of, for example, 1500 nm and composed of a silicon oxide is formed on the entire surface by, for example, a plasma TEOSCVD method.

Figure 2L:
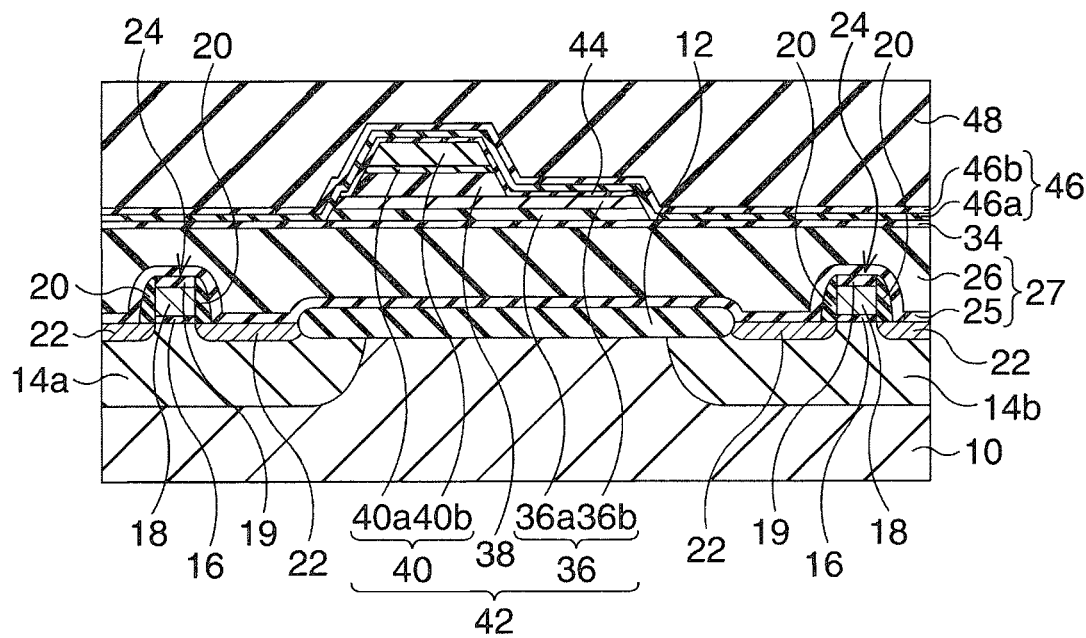
FIG. 2L is a cross-sectional view showing the method for manufacturing a ferroelectric memory, in order of processes, following FIG. 2K.

Next, as shown in FIG. 2L, a surface of the interlayer insulating film 48 is planarized by, for example, a CMP method. Then, thermal treatment in an atmosphere of plasma generated by using N$_2$O gas or N$_2$ gas is performed, for example, at 350° C. for two minutes. As a result of the thermal treatment, moisture in the interlayer insulating film 48 is removed, and the interlayer insulating film 48 changes in property, which makes it difficult for moisture to enter the interlayer insulating film 48. Further, this thermal treatment nitrides the surface of the interlayer insulating film 48, so that a SiON film (not shown) is formed on the surface of the interlayer insulating film 48.

Figure 2M:
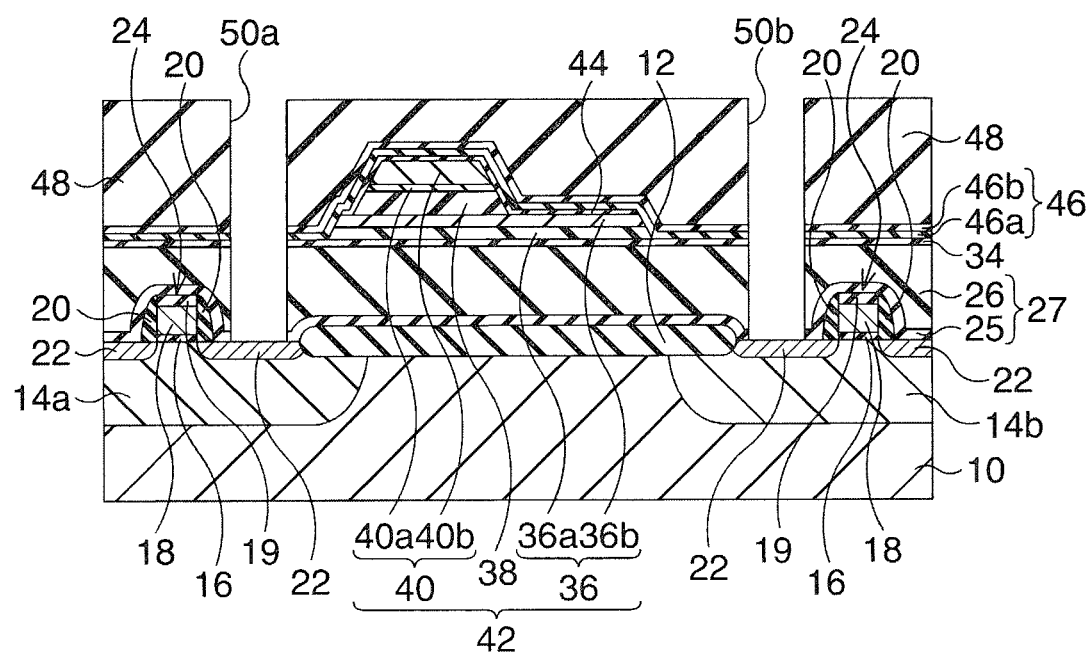
FIG. 2M is a cross-sectional view showing the method for manufacturing a ferroelectric memory, in order of processes, following FIG. 2L.

Next, as shown in FIG. 2M, contact holes 50a and 50b reaching the source/drain diffusion layers 22 are formed in the interlayer insulating film 48, the barrier film 46, the silicon oxide film 34, and the interlayer insulating film 27 by photolithography and etching.

In a case where only an aluminum oxide film is formed as the barrier film 46 and this aluminum oxide film is made thick for improved moisture resistance, it is difficult to process the aluminum oxide film, which makes it difficult to form the contact holes into a desired form. On the other hand, in this embodiment, the titanium oxide film 46b is formed as a part of the barrier film 46 and the titanium oxide film 46 easily reacts with etching gas (for example, chlorine or fluorine). Further, since the titanium oxide film 46b also exhibits a barrier effect, the aluminum oxide film 46a may be thin. The thin aluminum oxide film 46a can be easily sputter-etched with argon gas. Therefore, in this embodiment, the contact holes 50a and 50b in a desired shape can be easily formed.

Next, a Ti film (not shown) having a thickness of, for example, 20 nm is formed on the entire surface by, for example, a sputtering method. Subsequently, a TiN film (not shown) having a thickness of, for example, 50 nm is formed on the entire surface by, for example, a sputtering method. These Ti film and TiN film constitute a barrier metal film (not shown). Next, a tungsten film having a thickness of, for example, 500 nm is formed on the entire surface by, for example, a CVD method. Next, the tungsten film and the barrier metal film are polished by, for example, a CMP method, until the surface of the interlayer insulating film 48 is exposed. As a result, as shown in FIG. 2N, conductive plugs 54a, 54b containing tungsten are buried in the contact holes 50a and 50b respectively. This is followed by plasma cleaning using, for example, argon gas. Consequently, a natural oxide film and the like existing on surfaces of the conductive plugs 54a and 54b are removed.

Next, as shown in FIG. 2O, a SiON film 104 having a thickness of, for example, 100 nm is formed on the entire surface by, for example, a CVD method. Next, contact holes 52a reaching the top electrodes 40 of the ferroelectric capacitors 42 and contact holes 52b reaching the bottom electrodes 36 of the ferroelectric capacitors 42 are formed in the SiON film 104, the interlayer insulating film 48, the barrier film 46, and the barrier film 44 by photolithography and dry etching.

Then, thermal treatment in an oxygen atmosphere is performed, for example, at 400° C. to 600° C. for 30 minutes to 120 minutes. As a result, oxygen is supplied to the ferroelectric film 38, so that the electric characteristic of the ferroelectric capacitors 42 is recovered. Incidentally, the thermal treatment may be performed in an ozone atmosphere instead of the oxygen atmosphere. In a case where the thermal treatment is performed in the ozone atmosphere, oxygen is also supplied to the ferroelectric film 38, so that the electric characteristic of the ferroelectric capacitors 42 is recovered.

Figure 2P:
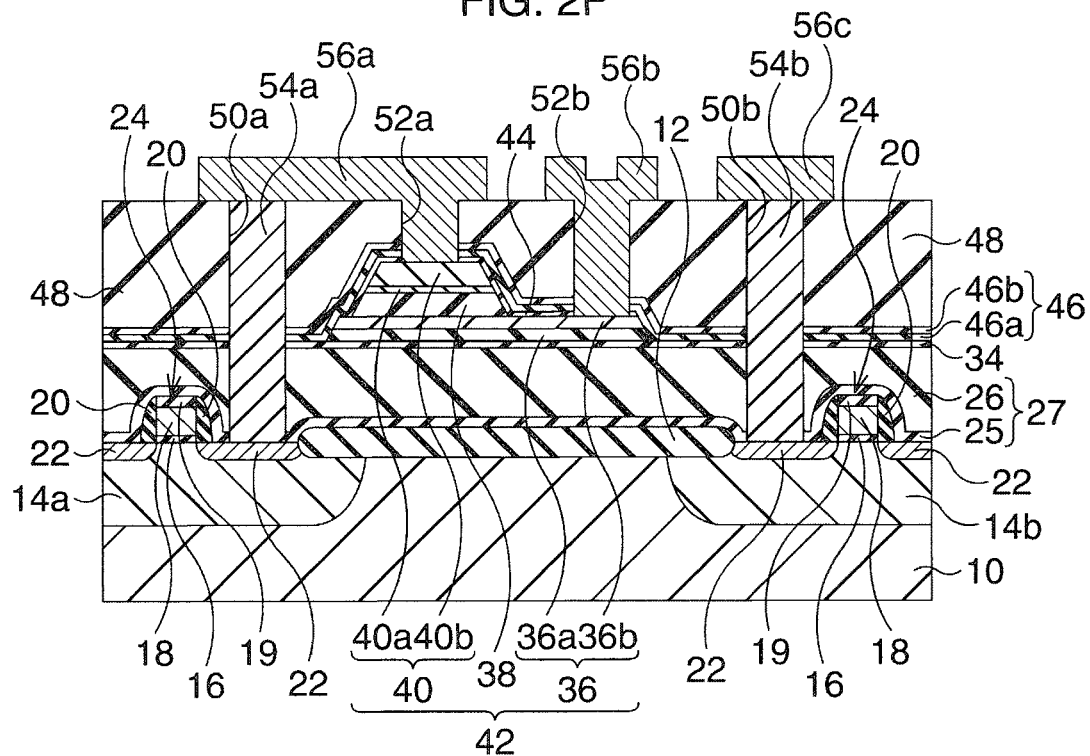
FIG. 2P is a cross-sectional view showing the method for manufacturing a ferroelectric memory, in order of processes, following FIG. 2O.

After the annealing, the SiON film 104 is removed by etching as shown in FIG. 2P. Then, a TiN film (not shown) having a thickness of, for example, 150 nm, an AlCu alloy film (not shown) having a thickness of, for example, 550 nm, a Ti film (not shown) having a thickness of, for example, 5 nm, and a TiN film (not shown) having a thickness of, for example, 150 nm are stacked in this order on the entire surface. As a result, a conductive film composed of the TiN film, the AlCu alloy film, the Ti film, and the TiN film is formed.

Next, as shown also in FIG. 2P, the conductive film is patterned by photolithography and dry etching. As a result, first metal wiring layers 56a, 56b, and 56c are formed. Specifically, the wirings 56a electrically connected to the top electrodes 40 and the conductive plugs 54a, the wirings 56b electrically connected to the bottom electrodes 36, and the wirings 56c electrically connected to the conductive plugs 54b are formed. Then, thermal treatment in an oxygen atmosphere is performed at, for example, 350° C. for 30 minutes.

Figure 2Q:
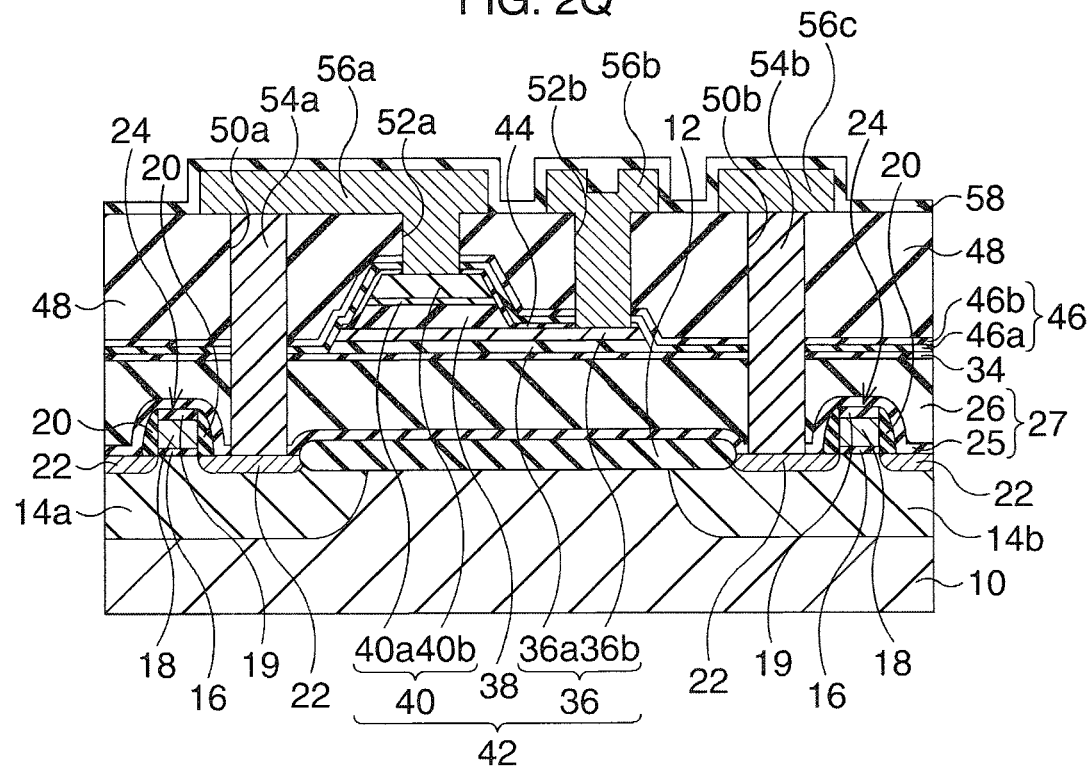
FIG. 2Q is a cross-sectional view showing the method for manufacturing a ferroelectric memory, in order of processes, following FIG. 2P.

Next, as shown in FIG. 2Q, a barrier film 58 is formed on the entire surface by, for example, a sputtering method or a CVD method. As the barrier film 58, an aluminum oxide film having a thickness of, for example, 20 nm to 70 nm is formed. As a result, upper surfaces and side surfaces of the wirings 56a, 56b, and 56c are covered by the barrier film 58.

Figure 2R:
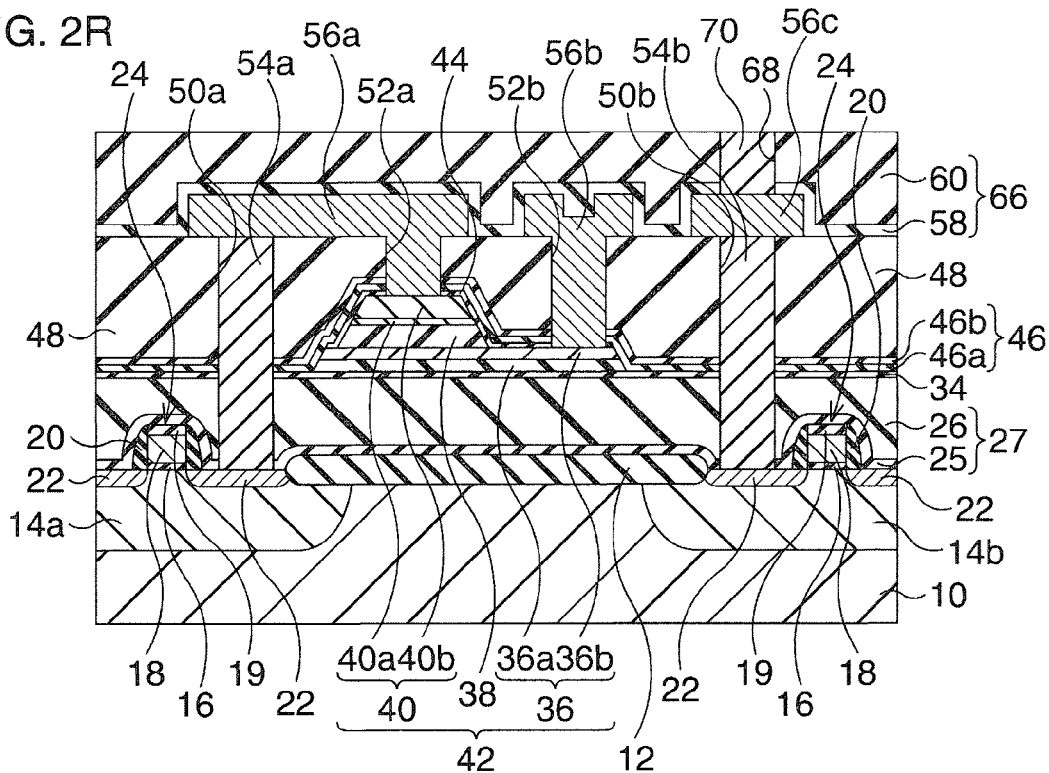
FIG. 2R is a cross-sectional view showing the method for manufacturing a ferroelectric memory, in order of processes, following FIG. 2Q.

Next, as shown in FIG. 2R, a silicon oxide film 60 having a thickness of, for example, 2600 nm is formed on the entire surface by, for example, a plasma TEOSCVD method. Next, a surface of the silicon oxide film 60 is planarized by, for example, a CMP method.

Then, thermal treatment in an atmosphere of plasma generated by using N$_2$O gas or N$_2$ gas is performed, for example, at 350° C. for four minutes. As a result of the thermal treatment, moisture in the silicon oxide film 60 is removed, and the silicon oxide film 60 changes in property, which makes it difficult for moisture to enter the silicon oxide film 60. This thermal treatment nitrides the surface of the silicon oxide film 60, so that a SiON film (not shown) is formed on the surface of the silicon oxide film 60. The barrier film 58 and the silicon oxide film 60 constitute an interlayer insulating film 66.

Next, as shown also in FIG. 2R, contact holes 68 reaching the wirings 56c are formed in the silicon oxide film 60 and the barrier film 58 by photolithography and dry etching. Then, thermal treatment in a $N_2$ atmosphere is performed, for example, at 350° C. for 120 minutes. Next, a TiN film (not shown) having a thickness of, for example, 50 nm is formed as a barrier metal film on the entire surface by, for example, a sputtering method. Next, a tungsten film having a thickness of, for example, 500 nm is formed on the entire surface by, for example, a CVD method. Next, the tungsten film and the TiN film are etched back by, for example, an EB (etch-back) method until a surface of the silicon oxide film 60 is exposed. As a result, conductive plugs 70 containing tungsten are buried in the contact holes 68.

Figure 2S:
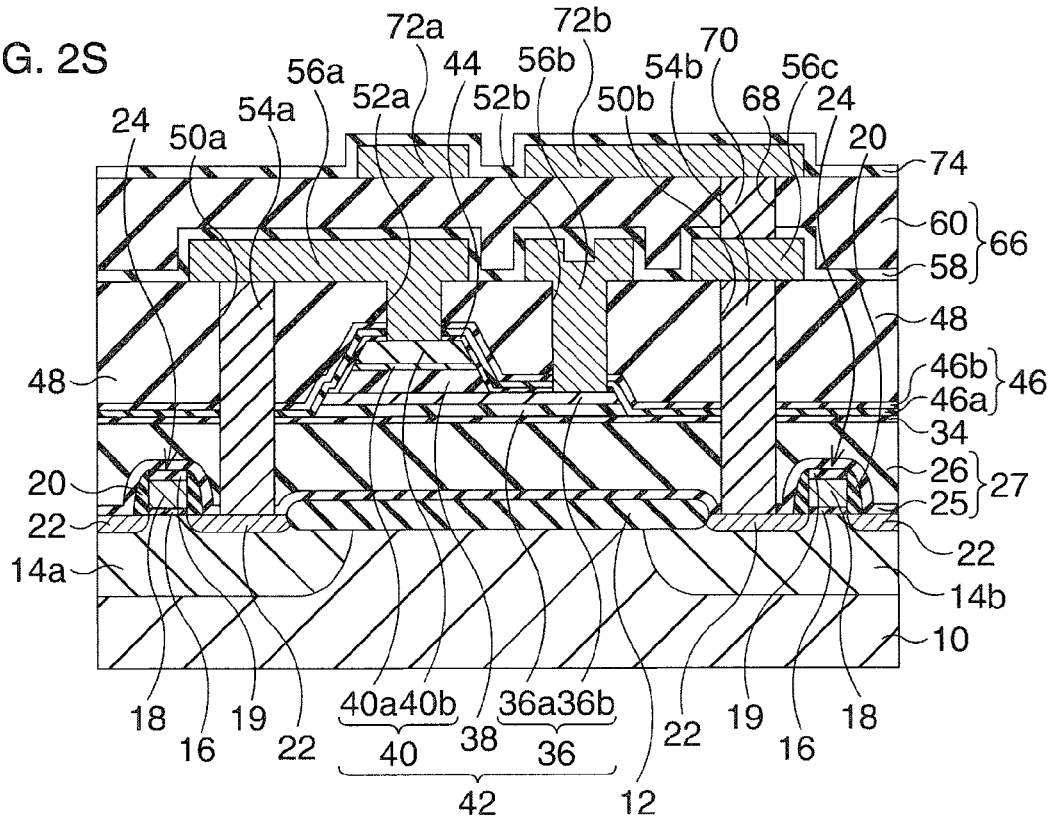
FIG. 2S is a cross-sectional view showing the method for manufacturing a ferroelectric memory, in order of processes, following FIG. 2R.

Next, an AlCu alloy film having a thickness of, for example, 500 nm, a Ti film having a thickness of, for example, 5 nm, and a TiN film having a thickness of, for example, 150 nm are stacked on the entire surface in this order. As a result, a conductive film composed of the TiN film, the AlCu alloy film, the Ti film, and the TiN film is formed. Next, the conductive film is patterned by photolithography and dry etching. As a result, as shown in FIG. 2S, second metal wiring layers 72a and 72b are formed. The wirings 72b are electrically connected to the conductive plugs 70. Next, a barrier film 74 is formed on the entire surface by, for example, a sputtering method or a CVD method. As the barrier film 74, an aluminum oxide film having a thickness of, for example, 20 nm to 70 nm is formed.

Figure 2T:
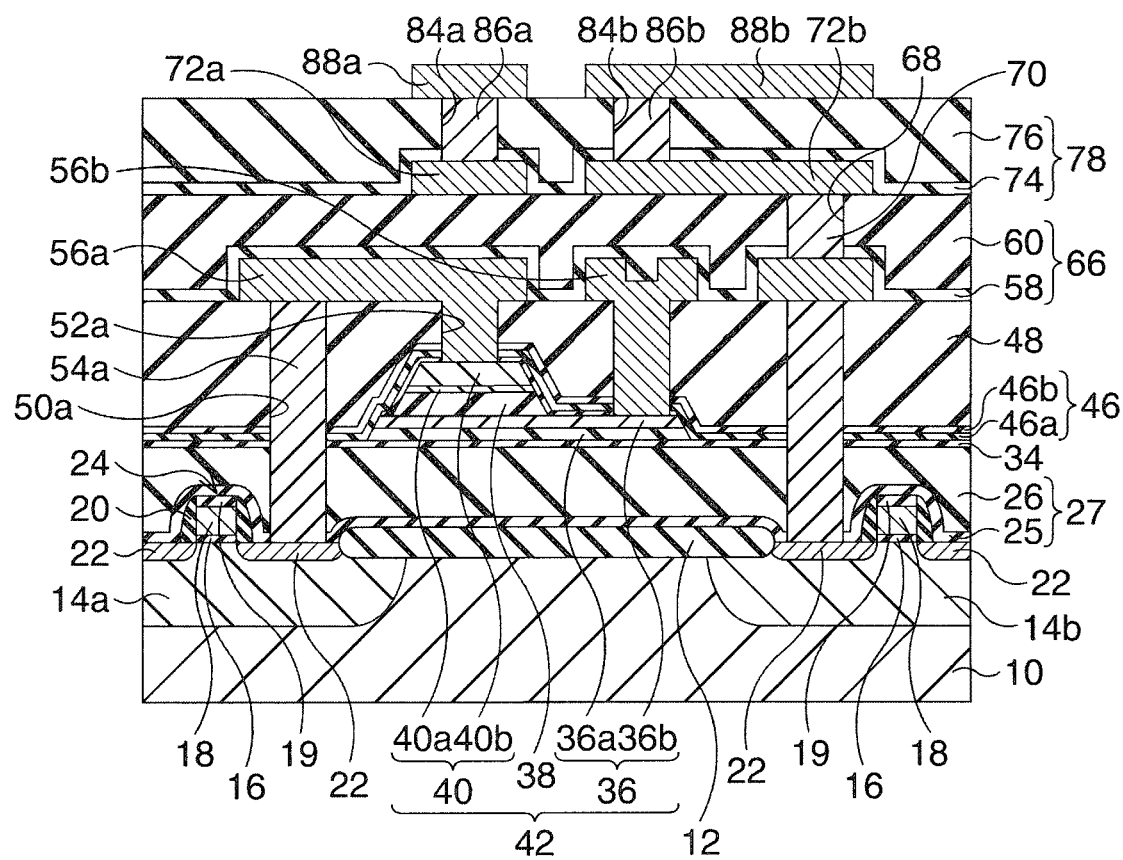
FIG. 2T is a cross-sectional view showing the method for manufacturing a ferroelectric memory, in order of processes, following FIG. 2S.
Figure 2U:
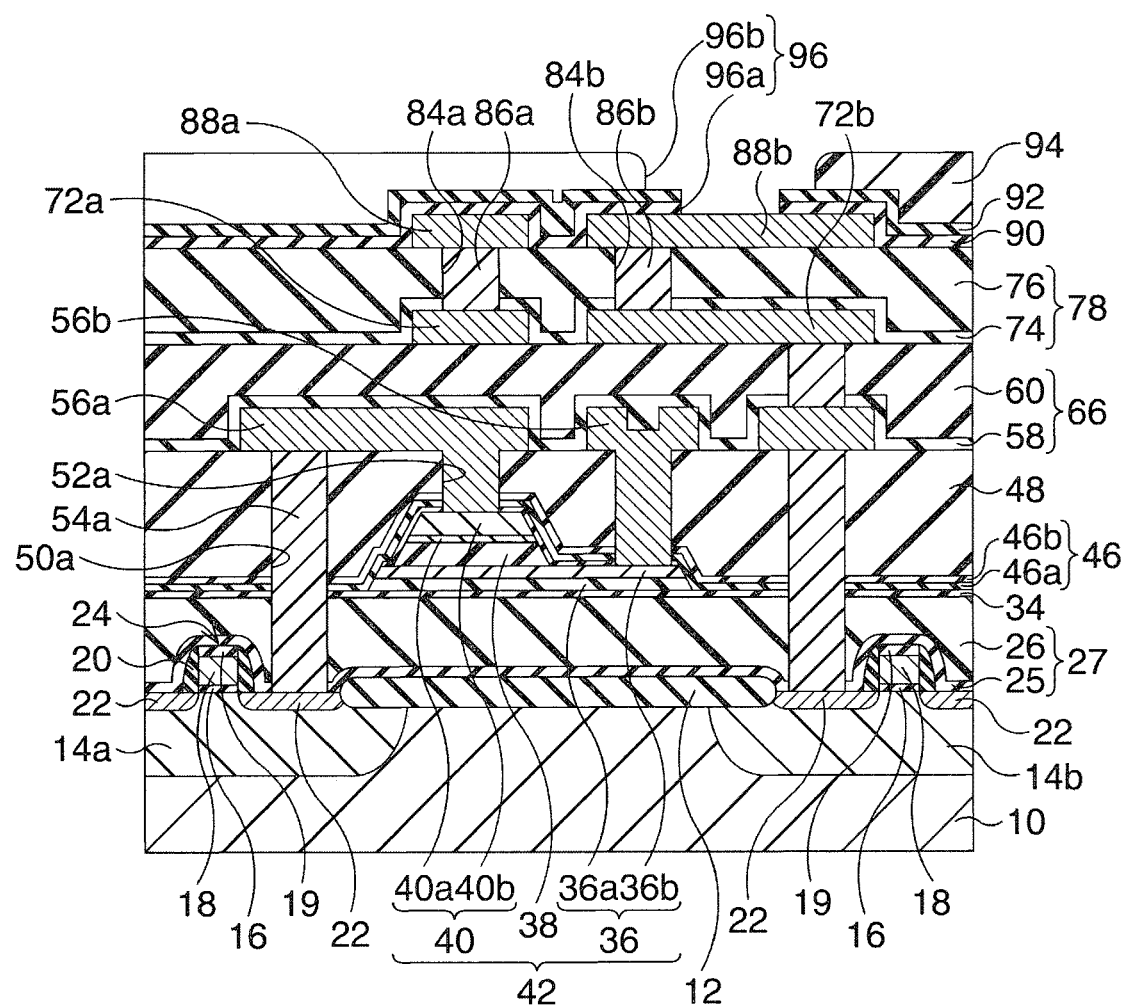
FIG. 2U is a cross-sectional view showing the method for manufacturing a ferroelectric memory, in order of processes, following FIG. 2T.

Next, as shown in FIG. 2T, a silicon oxide film 76 having a thickness of, for example, 2200 nm is formed on the entire surface by, for example, a plasma TEOSCVD method. Next, a surface of the silicon oxide film 76 is planarized by, for example, a CMP method. Then, thermal treatment in an atmosphere of plasma generated by using $N_2O$ gas or $N_2$ gas is performed, for example, at 350° C. for four minutes. As a result of the thermal treatment, moisture in the silicon oxide film 76 is removed, and the silicon oxide film 76 changes in property, which makes it difficult for moisture to enter the silicon oxide film 76. Further, this thermal treatment nitrides the surface of the silicon oxide film 76, so that a SiON film (not shown) is formed on the surface of the silicon oxide film 76. The barrier film 74 and the silicon oxide film 76 constitute an interlayer insulating film 78.

Next, as shown also in FIG. 2T, contact holes 84a reaching the wirings 72a and contact holes 84b reaching the wirings 72b are formed in the silicon oxide film 76 and the barrier film 74 by photolithography and dry etching. Then, thermal treatment in a $N_2$ atmosphere is performed, for example, at 350° for 120 minutes. Next, a TiN film (not shown) having a thickness of, for example, 50 nm is formed as a barrier metal film on the entire surface by, for example, a sputtering method. Next, a tungsten film having a thickness of, for example, 500 nm is formed on the entire surface by, for example, a CVD method. Next, the tungsten film and the TiN film are etched back by, for example, an EB method until a surface of the silicon oxide film 76 is exposed. As a result, conductive plugs 86a, 86b containing tungsten are buried in the contact holes 84a and 84b respectively.

Next, an AlCu alloy film having a thickness of, for example, 500 nm and a TiN film having a thickness of, for example, 150 nm are stacked on the entire surface in this order. As a result, a conductive film composed of the TiN film, the AlCu alloy film, and the TiN film is formed. Next, the conductive film is patterned by photolithography and dry etching. As a result, as shown also in FIG. 2T, third metal wiring layers 88a and 88b are formed. Specifically, the wirings 88a electrically connected to the conductive plugs 86a and the wirings 88b electrically connected to the conductive plugs 86b are formed.

Next, as shown in FIG. 2U, a silicon oxide film 90 having a thickness of, for example, 100 nm is formed on the entire surface by, for example, a plasma TEOSCVD method. Then, thermal treatment in an atmosphere of plasma generated by using $N_2O$ gas or $N_2$ gas is performed, for example, at 350° C. for two minutes. As a result of the thermal treatment, moisture in the silicon oxide film 90 is removed, and the silicon oxide film 90 changes in property, which make it difficult for moisture to enter the silicon oxide film 90. This thermal treatment nitrides a surface of the silicon oxide film 90, so that a SiON film (not shown) is formed on the surface of the silicon oxide film 90.

Next, as shown also in FIG. 2U, a silicon nitride film 92 having a thickness of, for example, 350 nm is formed by, for example, a CVD method. The silicon nitride film 92 can shut off moisture and prevent the corrosion of the first to third metal wiring layers and so on due to moisture. Next, the silicon nitride film 92 and the silicon oxide film 90 are patterned by using a photoresist film (not shown), so that openings 96a reaching the wirings (bonding pads) 88b are formed in the silicon nitride film 92 and the silicon oxide film 90. Thereafter, the photoresist film is removed.

Next, as shown also in FIG. 2U, a polyimide resin film 94 having a thickness of, for example, 2 μm to 6 μm is formed by, for example, a spin coating method. Next, openings 96b from which the openings 96a are exposed are formed in the polyimide resin film 94 by photolithography. The openings 96a and 96b constitute openings 96 for bonding. In the above-described manner, the semiconductor device is completed.

In this embodiment as above, since the barrier film 46 is composed of the aluminum oxide film 46a and the titanium oxide film 46b as described above, it is possible to easily process these films while ensuring a sufficient barrier effect. Therefore, the contact holes 50a and 50b in a desired shape can be easily formed.

Therefore, favorable test results can also be obtained, in particular, in a PTHS (Pressure Temperature Humidity Stress) test (JEDEC standard or the like) which is one of accelerated life tests.

In FIG. 2U, for convenience sake, the opening 96 is shown at a position overlapping with the ferroelectric capacitor 42 in a plane view, but in layout, it is preferable that pad regions including the openings 96 are provided around regions where elements such as the ferroelectric capacitors 42 and so on are formed.

Figure 4A:
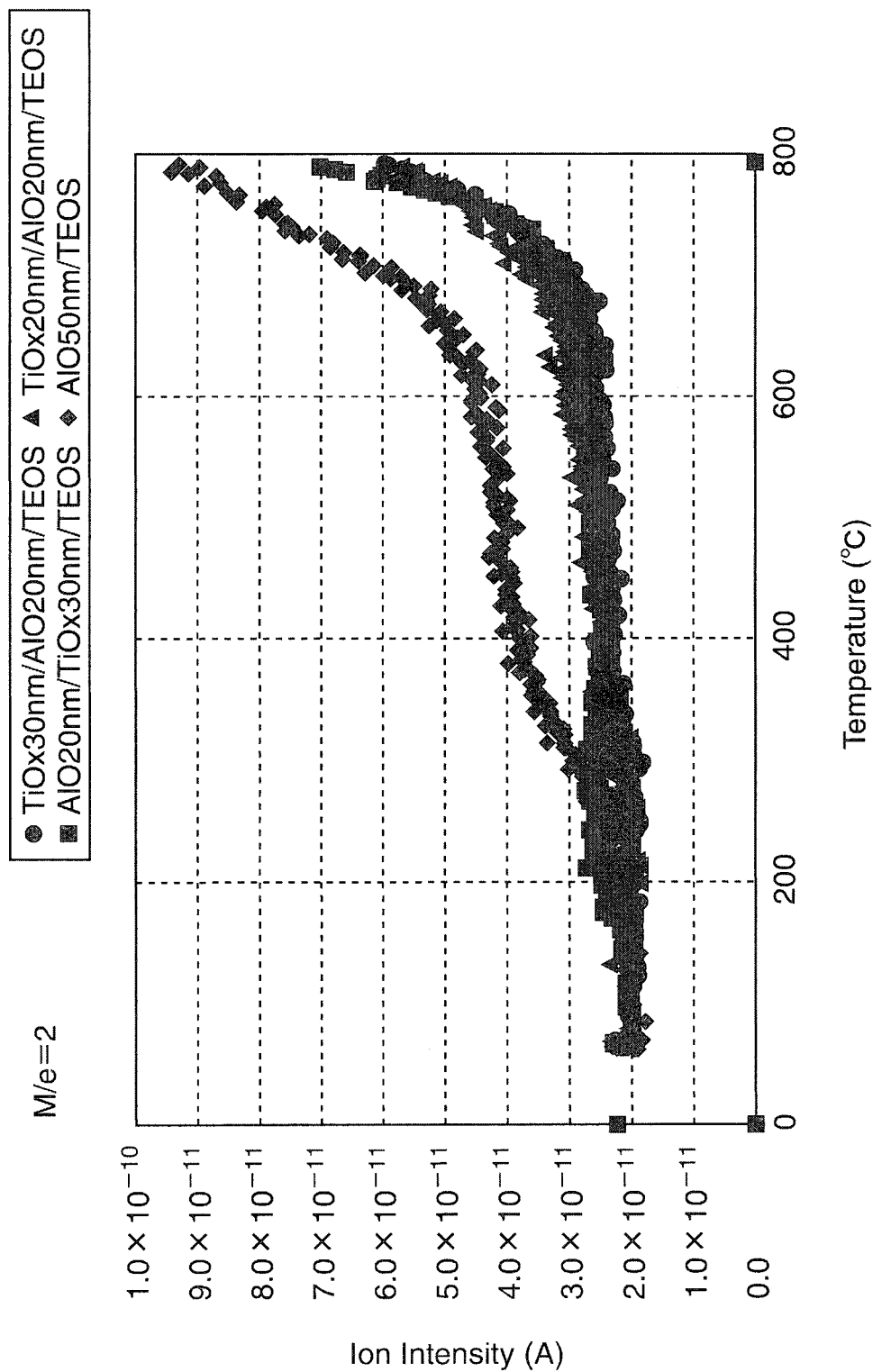
FIG. 4A is a graph showing results of TDS analysis of a substance ($H_2$) whose molecular weight is 2.
Figure 4B:
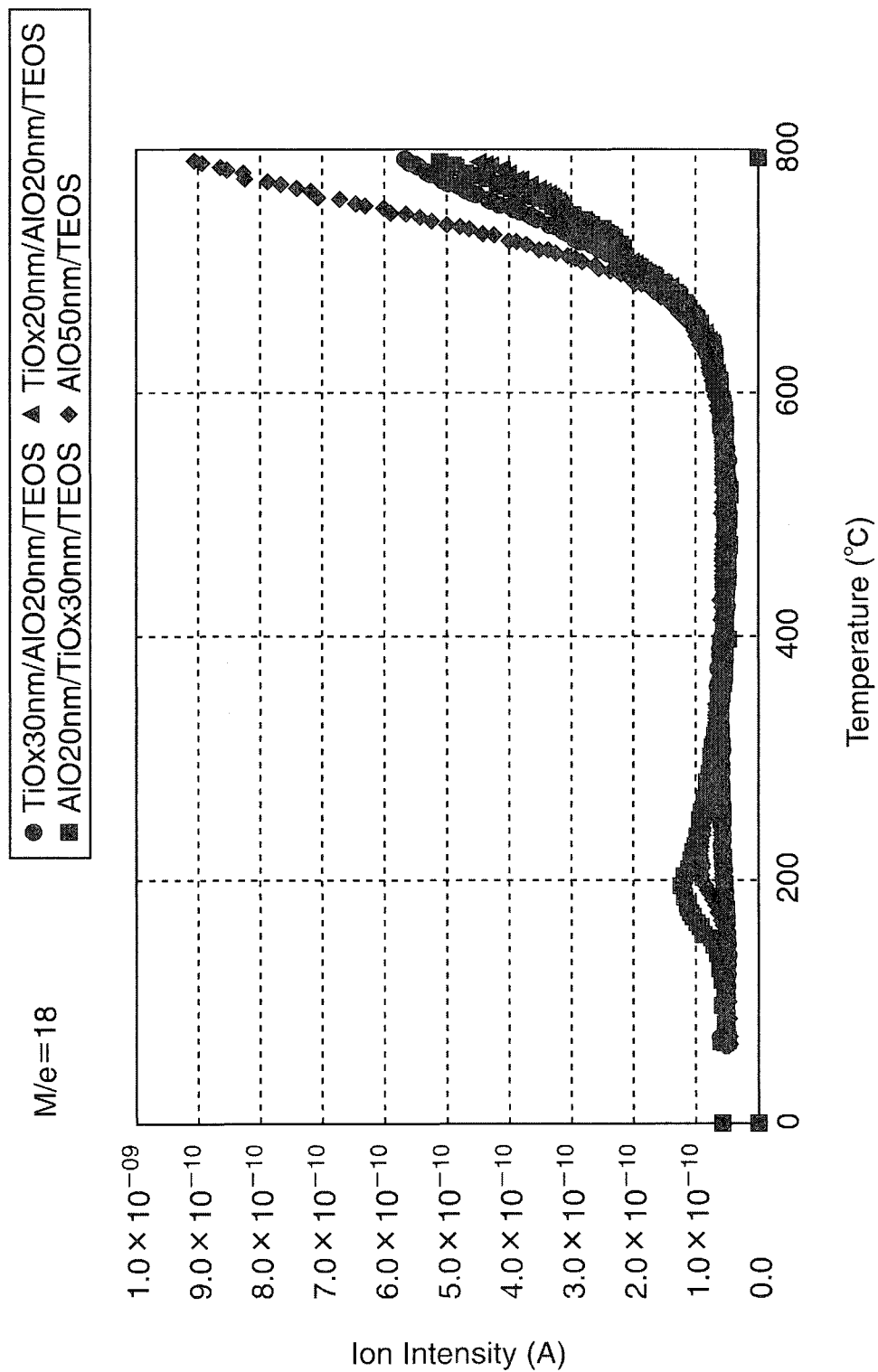
FIG. 4B is a graph showing results of TDS analysis of a substance ($H_2O$) whose molecular weight is 18.

Next, a description will be given of results of TDS (Temperature Desorption Spectroscopy) analysis conducted on various barrier films each formed on a silicon oxide film formed by using TEOS. Here, the following samples were used: (sample a) having a barrier film in which a titanium oxide film with a 30 nm thickness is formed on an aluminum oxide film with a 20 nm thickness; (sample b) having a barrier film in which a titanium oxide film with a 20 nm thickness is formed on an aluminum oxide film with a 20 nm thickness; (sample c) having a barrier film in which an aluminum oxide film with a 20 nm thickness is formed on a titanium oxide film with a 30 nm thickness; and (sample d) having a barrier film comprised only of an aluminum oxide film with a 50 nm thickness. The results are shown in FIG. 4A and FIG. 4B. FIG. 4A shows the analysis results of a substance ($H_2$) whose molecular weight is 2. FIG. 4B shows the analysis results of a substance ($H_2O$) whose molecular weight is 18.

As shown in FIG. 4A, in the sample d (♦), whose barrier film is comprised only of the aluminum oxide film, a generation amount of hydrogen increased at 300° C. or higher. In the sample a (●), the sample b (▲), and the sample c (■) each including not only the aluminum oxide film but also the titanium oxide film, hydrogen little increased in a temperature range below 700° C. From the results, it can be said that the barrier film 46 has a remarkably high ability to bar the transmittance of hydrogen.

Further, as shown in FIG. 4B, in the sample d (♦), a generation amount of water at 700° C. or higher greatly increased compared with those in the sample a (●) the sample b (▲), and the sample c (■). Further, in the sample c (■) and the sample d (♦), in each of which the aluminum oxide film exists on the uppermost surface, a generation amount of water increased at about 200° C., but in the sample a (●) and the sample b (▲), in each of which the titanium oxide film exists on the uppermost surface, such a phenomenon did not occur. From the above, a preferable barrier film is that in which the titanium oxide film is formed on the aluminum oxide film.

(Second Embodiment)

Figure 5A:
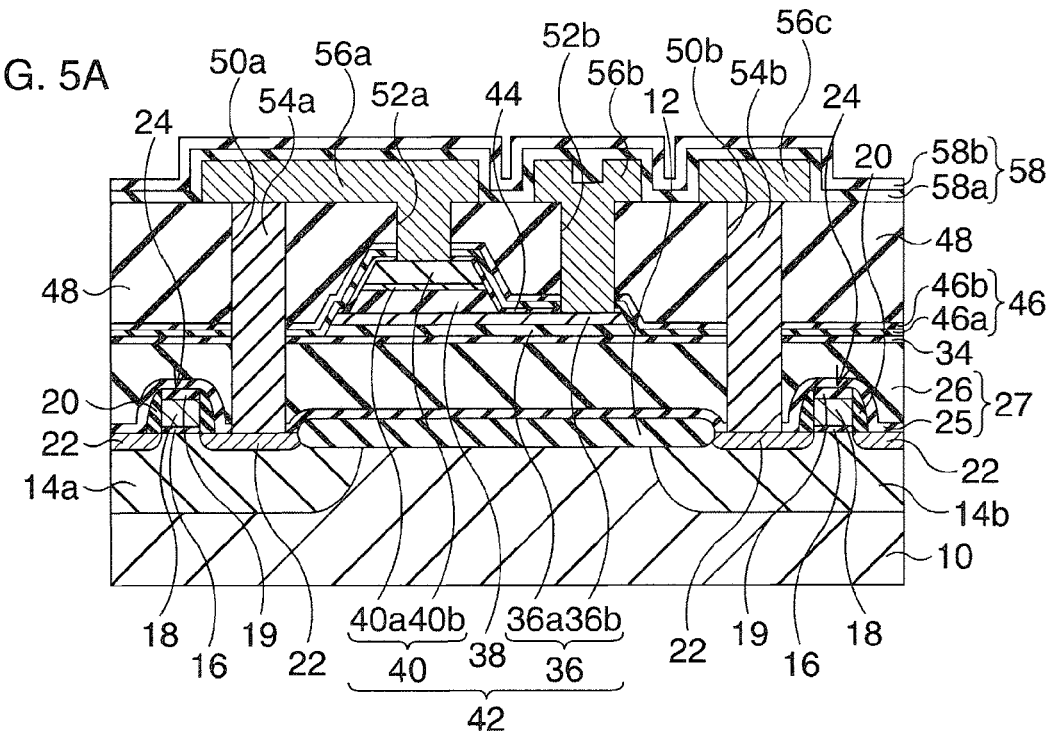
FIG. 5A is a cross-sectional view showing a method for manufacturing a ferroelectric memory according to a second embodiment, in order of processes.
Figure 5B:
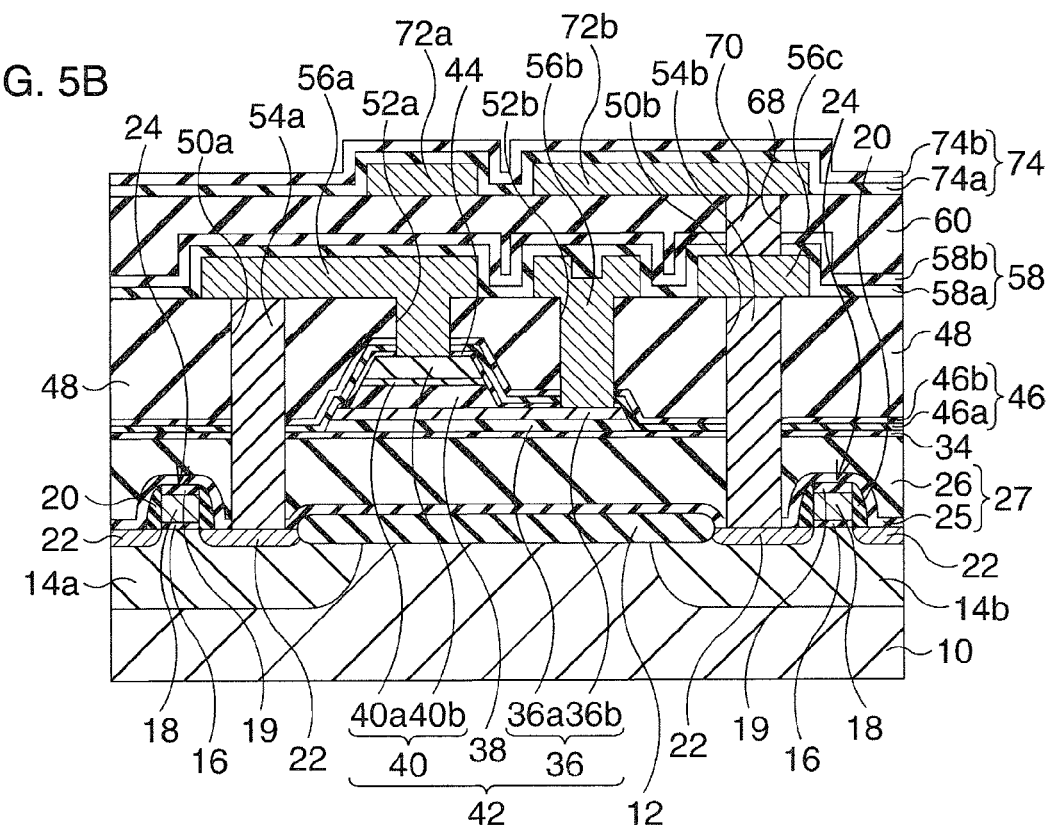
FIG. 5B is a cross-sectional view showing the method for manufacturing a ferroelectric memory, in order of processes, following FIG. 5A.
Figure 5C:
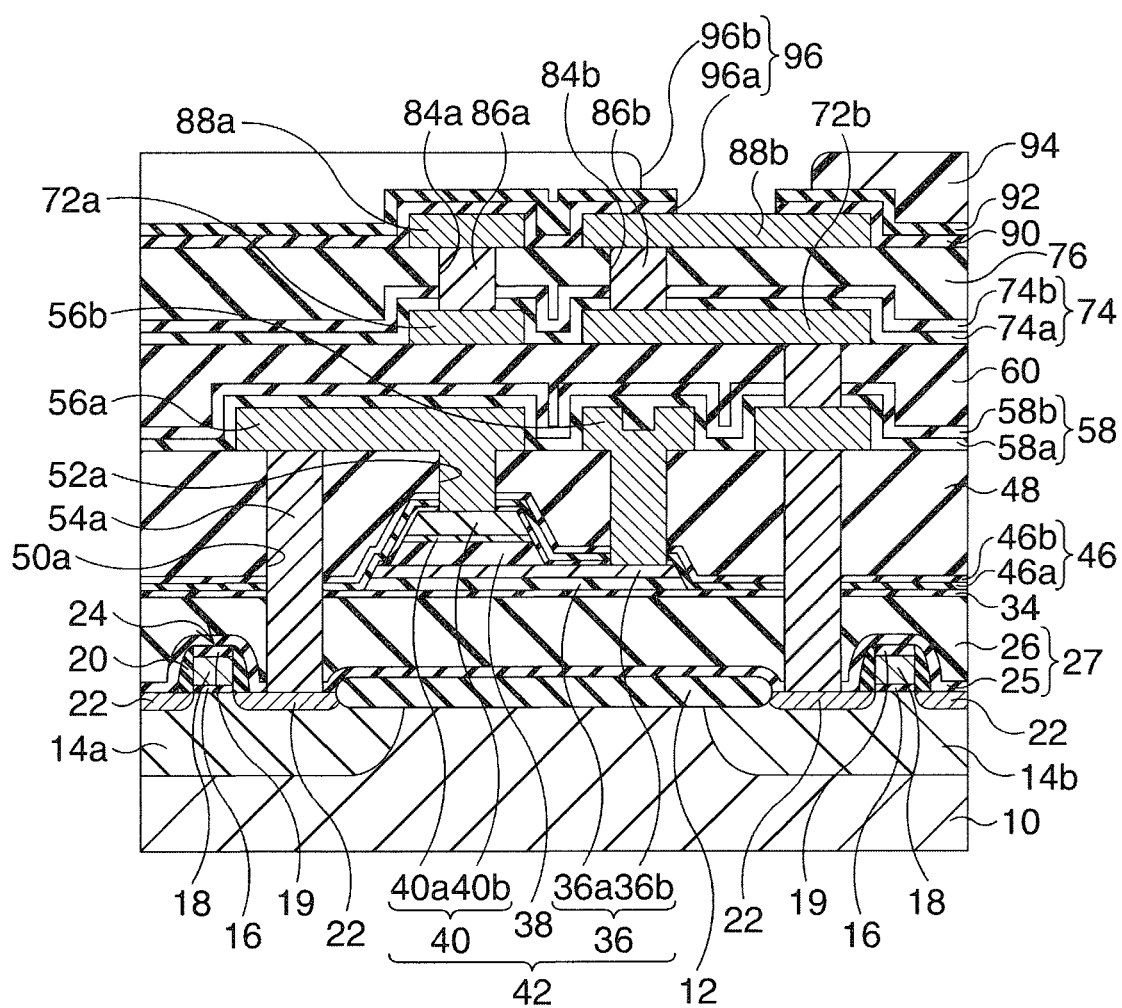
FIG. 5C is a cross-sectional view showing the method for manufacturing a ferroelectric memory, in order of processes, following FIG. 5B.

Next, a second embodiment will be described. Here too, for convenience sake, a cross-sectional structure of a semiconductor device will be described along with its manufacturing method. FIG. 5A to FIG. 5C are cross-sectional views showing a method for manufacturing a ferroelectric memory (semiconductor device) according to the second embodiment, in order of processes.

In this embodiment, as shown in FIG. 5A, processes up to the formation of first wirings 56a, 56b, and 56c are first performed in the same manner as in the first embodiment. Then, thermal treatment in an oxygen atmosphere is performed, for example, at 350° C. for 30 minutes. Next, as shown also in FIG. 5A, a barrier film 58 is formed on the entire surface. As a result, upper surfaces and side surfaces of the wirings 56a, 56b, and 56c are covered by the barrier film 58.

Figure 6A:
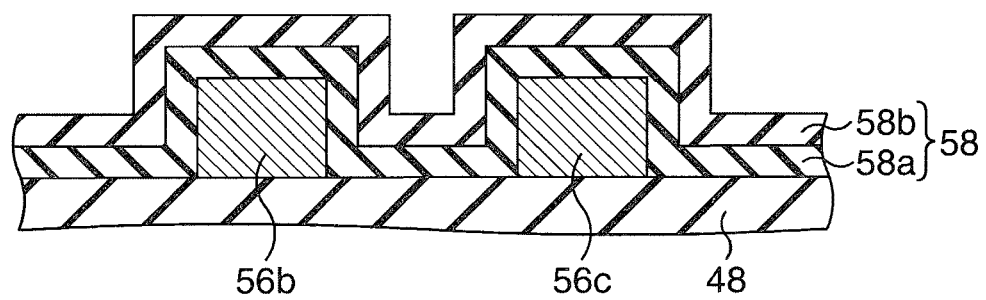
FIG. 6A is a cross-sectional view showing a method for forming a barrier film 58.

In this embodiment, in forming the barrier film 58, an aluminum oxide film 58a having a thickness of, for example, 20 nm is first formed by a sputtering method or a CVD method as shown in FIG. 6A. Next, a titanium oxide film 58b having a thickness of, for example, 20 nm is formed on the aluminum oxide film 58a by, for example, a sputtering method or a CVD method.

Figure 6B:
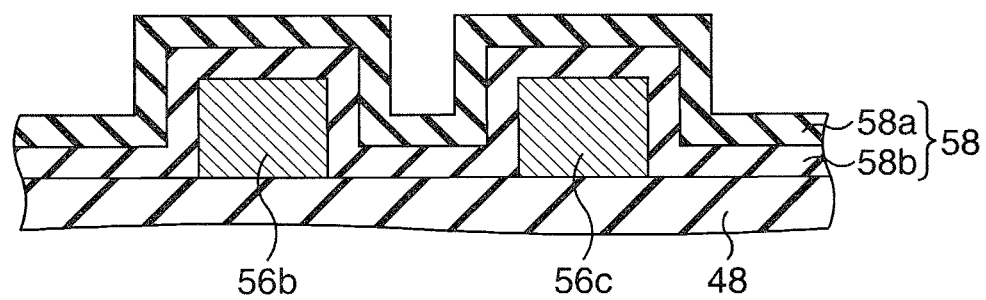
FIG. 6B is a cross-sectional view showing another method for forming the barrier film 58.

Incidentally, another possible method for forming the barrier film 58 is to form the titanium oxide film 58b having a thickness of, for example, 20 nm to 30 nm and then form the aluminum oxide film 58a having a thickness of, for example, 20 nm on top the titanium oxide film 58b, as shown in FIG. 6B.

Further, whichever of the aluminum oxide film 58a and the titanium oxide film 58b is first formed, thermal treatment in an oxygen atmosphere is preferably performed, for example, at 500° C. to 700° C. for 30 minutes to 120 minutes before the formation of the film formed later (the titanium oxide film 58b or the aluminum oxide film 58a).

Further, in forming the titanium oxide film 58b, after a metallic titanium film is formed by a sputtering method, the metallic titanium film may be oxidized by annealing in an oxygen atmosphere, for example, at 300° C. to 700° C. for one minute to 120 minutes.

After the formation of the barrier film 58, processes from the formation of a silicon oxide film 60 up to the formation of second wirings 72a and 72b are performed in the same manner as in the first embodiment, as shown in FIG. 5B. It should be noted that, in this embodiment, the titanium oxide film 58b is formed as a part of the barrier film 58, and the titanium oxide film 58b easily reacts with etching gas (for example, chlorine or fluorine). Further, since the titanium oxide film 58b also exhibits a barrier effect, the aluminum oxide film 58a may be thin. The thin aluminum oxide film 58a can be easily sputter-etched with argon gas. Therefore, in this embodiment, it is possible to more easily form contact holes 68.

After the formation of the second wirings 72a and 72b, a barrier film 74 is formed on the entire surface, as shown also in FIG. 5B. As a result, upper surfaces and side surfaces of the wirings 72a and 72c are covered by the barrier film 74.

In this embodiment, in forming the barrier film 74, an aluminum oxide film 74a having a thickness of, for example, 20 nm is first formed by a sputtering method or a CVD method. Next, a titanium oxide film 74b having a thickness of, for example, 20 nm is formed on the aluminum oxide film 74a by, for example, a sputtering method or a CVD method.

Incidentally, another possible method for forming the barrier film 74 is to form the titanium oxide film 74b having a thickness of, for example, 20 nm to 30 nm and then form the aluminum oxide film 74a having a thickness of, for example, 20 nm on the titanium oxide film 74b.

Further, whichever of the aluminum oxide film 74a and the titanium oxide film 74b is first formed, thermal treatment in an oxygen atmosphere is preferably performed, for example, at 500° C. to 700° C. for 30 minutes to 120 minutes, before the formation of the film formed later (the titanium oxide film 74b or the aluminum oxide film 74a).

Further, in forming the titanium oxide film 74b, after a metallic titanium film is formed by a sputtering method, the metallic titanium film may be oxidized by annealing in an oxygen atmosphere, for example, at 300° C. to 700° C. for one minute to 120 minutes.

After the formation of the barrier film 74, processes from the formation of a silicon oxide film 76 up to the formation of openings 96 are performed in the same manner as in the first embodiment, as shown in FIG. 5C, thereby completing the semiconductor device. It should be noted that, in this embodiment, the titanium oxide film 74b is formed as a part of the barrier film 74, and this titanium oxide film 74b easily reacts with etching gas (for example, chlorine or fluorine). Further, since the titanium oxide film 74b also exhibits a barrier effect, the aluminum oxide film 74a may be thin. The thin aluminum oxide film 74a can be easily sputter-etched with argon gas. Therefore, in this embodiment, contact holes 84a and 84b can be more easily formed.

The second embodiment described above can provide the same effects as those of the first embodiment. In addition, since the barrier film covering the wirings is a film stack including the titanium oxide film, etching for forming the contact holes is further facilitated. This makes it more difficult for a contact failure to occur. Further, a barrier effect against moisture and hydrogen is also fully ensured.

In the first and second embodiments, the number of the wiring layers is three, but the number of the wiring layers may be four or more. Further, the barrier film composed of the film stack may be formed only for a part of the wiring layers.

(Third Embodiment)

Figure 7:
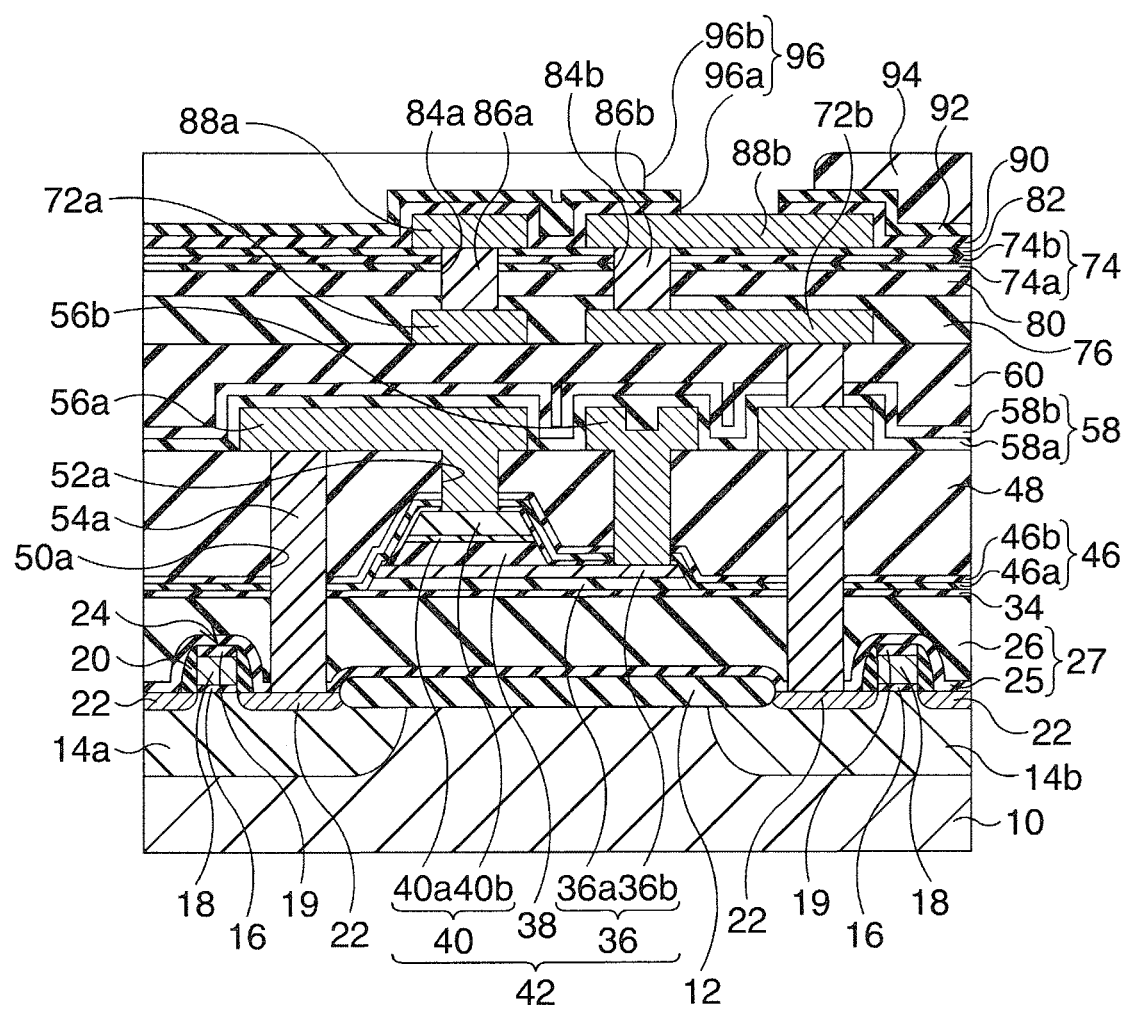
FIG. 7 is a cross-sectional view showing a ferroelectric memory according to a third embodiment.

Next, a third embodiment will be described. FIG. 7 is a cross-sectional view showing a ferroelectric memory (semiconductor device) according to the third embodiment.

In the second embodiment, the wirings 72a and 72b are directly covered by the barrier film 74. On the other hand, in the third embodiment, a barrier film 74 is a flat film. Specifically, a silicon oxide film 80 is formed on a planarized silicon oxide film 76, and on the silicon oxide film 80, the barrier film 74 composed of an aluminum oxide film 74a and a titanium oxide film 74b is formed. Further, a silicon oxide film 82 is formed on the barrier film 74. Wirings 88a and 88b and so on are formed on the silicon oxide film 82.

In manufacturing the semiconductor device according to the third embodiment, after processes up to the formation of wirings 72a and 72b are performed in the same manner as in the second embodiment, the silicon oxide film 76 having a thickness of, for example, 2200 nm is formed on the entire surface by, for example, a plasma TEOSCVD method. Next, a surface of the silicon oxide film 76 is planarized by, for example, a CMP method. Then, thermal treatment in an atmosphere of plasma generated by using $N_2O$ gas or $N_2$ gas is performed, for example, at 350° C. for four minutes. As a result of the thermal treatment, moisture in the silicon oxide film 76 is removed, and the silicon oxide film 76 changes in property, which makes it difficult for moisture to enter the silicon oxide film 76. This thermal treatment nitrides the surface of the silicon oxide film 76, so that a SiON film (not shown) is formed on the surface of the silicon oxide film 76.

Next, the silicon oxide film 80 having a thickness of, for example, 100 nm is formed on the entire surface by, for example, a plasma TEOSCVD method. Since the silicon oxide film 80 is formed on the planarized silicon oxide film 76, the silicon oxide film 80 becomes flat. Then, thermal treatment in an atmosphere of plasma generated by using $N_2O$ gas or $N_2$ gas is performed, for example, at 350° C. for two minutes. As a result of the thermal treatment, moisture in the silicon oxide film 80 is removed, and the silicon oxide film 80 changes in property, which makes it difficult for moisture to enter the silicon oxide film 80. This thermal treatment nitrides a surface of the silicon oxide film 80, so that a SiON film (not shown) is formed on the surface of the silicon oxide film 80.

Next, the barrier film 74 is formed on the flat silicon oxide film 80 by, for example, a sputtering method or a CVD method. In forming the barrier film 74, after the aluminum oxide film 74a is formed, the titanium oxide film 74b is formed. Since the barrier film 74 is formed on the flat silicon oxide film 80, the barrier film 74 becomes flat. Next, a silicon oxide film 82 having a thickness of, for example, 100 nm is formed on the entire surface by, for example, a plasma TEOSCVD method.

Thereafter, in the same manner as in the first embodiment, processes from the formation of contact holes 84a and 84b up to the formation of openings 96 are performed, thereby completing the semiconductor device.

The third embodiment described above, similarly to the second embodiment, also makes it possible to more easily form of the contact holes 84a and 84b. Further, coverage of the barrier film 74 is improved.

(Fourth Embodiment)

Figure 8:
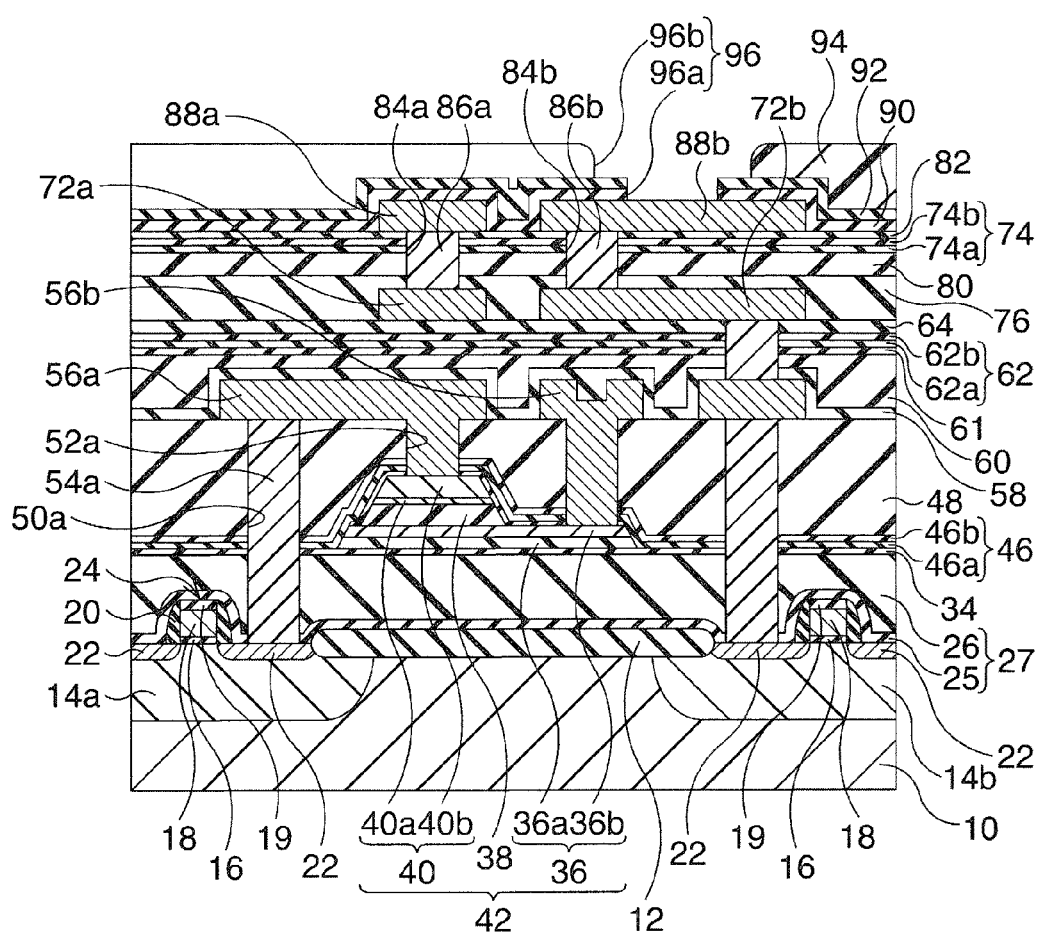
FIG. 8 is a cross-sectional view showing a ferroelectric memory according to a fourth embodiment.

Next, a fourth embodiment will be described. FIG. 8 is a cross-sectional view showing a ferroelectric memory (semiconductor device) according to the fourth embodiment.

In the third embodiment, the wirings 56a, 56b, and 56c are directly covered by the barrier film 58 composed of the aluminum oxide films 58a and the titanium oxide film 58b. On the other hand, in the fourth embodiment, a barrier film 58 is comprised only of an aluminum oxide film, and a flat barrier film is provided between the barrier film 58 and wirings 72a and 72b. Specifically, a silicon oxide film 61 is formed on a planarized silicon oxide film 60, and a barrier film 62 composed of an aluminum oxide film 62a and a titanium oxide film 62b is formed on the silicon oxide film 61. Further, a silicon oxide film 64 is formed on the barrier film 62. The wirings 72a and 72b and so on are formed on the silicon oxide film 64.

In manufacturing the semiconductor device according to the fourth embodiment, after processes up to the formation of wirings 56a, 56b, and 56c are performed in the same manner as in the first embodiment, the barrier film 58 composed of the aluminum oxide film is formed. Next, the silicon oxide film 60 having a thickness of, for example, 2600 nm is formed on the entire surface by, for example, a plasma TEOSCVD method. Next, a surface of the silicon oxide film 60 is planarized by, for example, a CMP method. Then, thermal treatment in an atmosphere of plasma generated by using $N_2O$ gas or $N_2$ gas is performed, for example, at 350° C. for four minutes. As a result of the thermal treatment, moisture in the silicon oxide film 60 is removed, and the silicon oxide film 60 changes in property, which makes it difficult for moisture to enter the silicon oxide film 60. This thermal treatment nitrides the surface of the silicon oxide film 60, so that a SiON film (not shown) is formed on the surface of the silicon oxide film 60.

Next, the silicon oxide film 61 having a thickness of, for example, 100 nm is formed on the entire surface by, for example, a plasma TEOSCVD method. Since the silicon oxide film 61 is formed on the planarized silicon oxide film 60, the silicon oxide film 61 becomes flat. Then, thermal treatment in an atmosphere of plasma generated by using $N_2O$ gas or $N_2$ gas is performed, for example, at 350° C. for two minutes. As a result of the thermal treatment, moisture in the silicon oxide film 61 is removed, and the silicon oxide film 61 changes in property, which makes it difficult for moisture to enter the silicon oxide film 61. This thermal treatment nitrides a surface of the silicon oxide film 61, so that a SiON film (not shown) is formed on the surface of the silicon oxide film 61.

Next, the barrier film 62 is formed on the flat silicon oxide film 61 by, for example, a sputtering method or a CVD method. In forming the barrier film 62, after an aluminum oxide film 62a is formed, a titanium oxide film 62b is formed, similarly to the formation of the barrier film 74 and the like in the third embodiment. Since the barrier film 62 is formed on the flat silicon oxide film 61, the barrier film 62 becomes flat. Next, a silicon oxide film 64 having a thickness of, for example, 100 nm is formed on the entire surface by, for example, a plasma TEOSCVD method.

Thereafter, in the same manner as in the third embodiment, processes from the formation of contact holes 68 up to the formation of openings 96 are performed, thereby completing the semiconductor device.

According to the fourth embodiment described above, it is also possible to more easily form the contact holes 68 and improve a barrier effect. Further, coverage of the barrier film 62 is improved.

(Fifth Embodiment)

Figure 9:
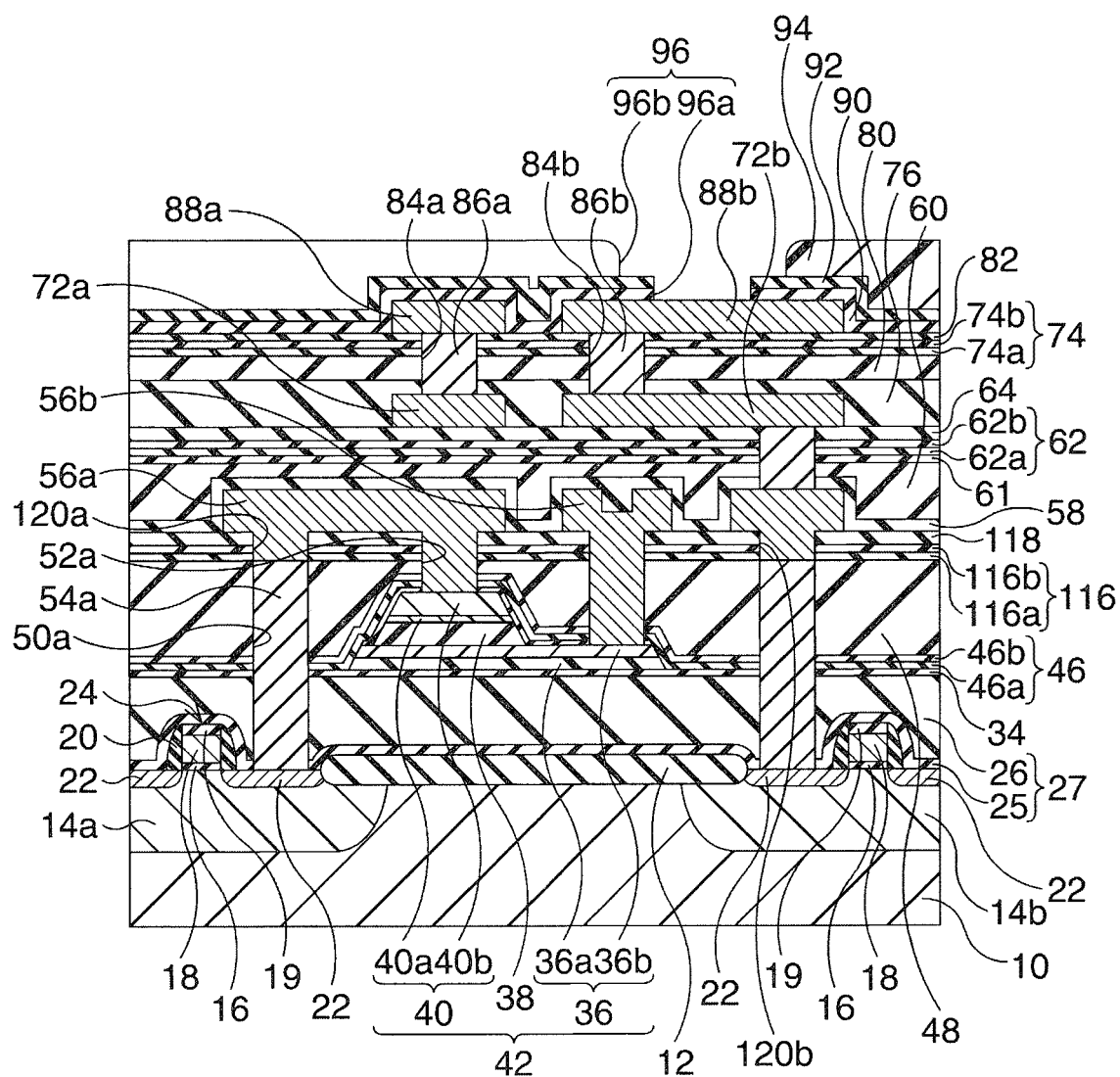
FIG. 9 is a cross-sectional view showing a ferroelectric memory according to a fifth embodiment.

Next, a fifth embodiment will be described. FIG. 9 is a cross-sectional view showing a ferroelectric memory (semiconductor device) according to the fifth embodiment.

In the fifth embodiment, a flat barrier film is provided between a barrier film 46 and wirings 56a, 56b, and 56c. Specifically, a barrier film 116 composed of an aluminum oxide film 116a and a titanium oxide film 116b is formed on a planarized silicon oxide film 48. Further, a silicon oxide film 118 is formed on the barrier film 116. The wirings 56a, 56b, and 56c and so on are formed on the silicon oxide film 118.

In manufacturing the semiconductor device according to the fifth embodiment, processes up to the formation of conductive plugs 54a and 54b are performed in the same manner as in the first embodiment, and then, there follows plasma cleaning using, for example, argon gas. Consequently, a natural oxide film and so on existing on surfaces of the conductive plugs 54a and 54b are removed. Next, by, for example, a sputtering method or a CVD method, the barrier film 116 is formed on the interlayer insulating film 48 in which the conductive plugs 54a, 54b are buried. In forming the barrier film 116, a titanium oxide film 116b is formed after an aluminum oxide film 116a is formed, similarly to the formation of the barrier film 74 and the like in the third embodiment. Since the barrier film 116 is formed on the flat silicon oxide film 48, the barrier film 116 becomes flat. Next, the silicon oxide film 118 having a thickness of, for example, 100 nm is formed on the entire surface by, for example, a plasma TEOSCVD method.

Next, contact holes 120a, 120b reaching the conductive plugs 54a and 54b respectively are formed in the silicon oxide film 118 and the barrier film 116 by photolithography and dry etching. Then, a SiON film (not shown) having a thickness of, for example, 100 nm is formed on the entire surface by, for example, a CVD method (see FIG. 24(a)). Next, contact holes 52a reaching top electrodes 40 and contact holes 52b reaching bottom electrodes 36 are formed in the SiON film, the silicon oxide film 118, the barrier film 116, the interlayer insulating film 48, the barrier film 46, and the barrier film 44 by photolithography and dry etching.

Then, thermal treatment in an oxygen atmosphere is performed, for example, at 500° C. for 60 minutes. As a result, oxygen is supplied to a ferroelectric film 38, and an electric characteristic of ferroelectric capacitors 42 is recovered. Next, the SiON film (not shown) is removed by etching.

Thereafter, in the same manner as in the fourth embodiment, processes from the formation of the wirings 56a, 56b, and 56c up to the formation of openings 96 are performed, thereby completing the semiconductor device.

According to the above fifth embodiment, it is possible to improve a barrier effect as well as easily form contact holes.

(Sixth Embodiment)

Figure 10:
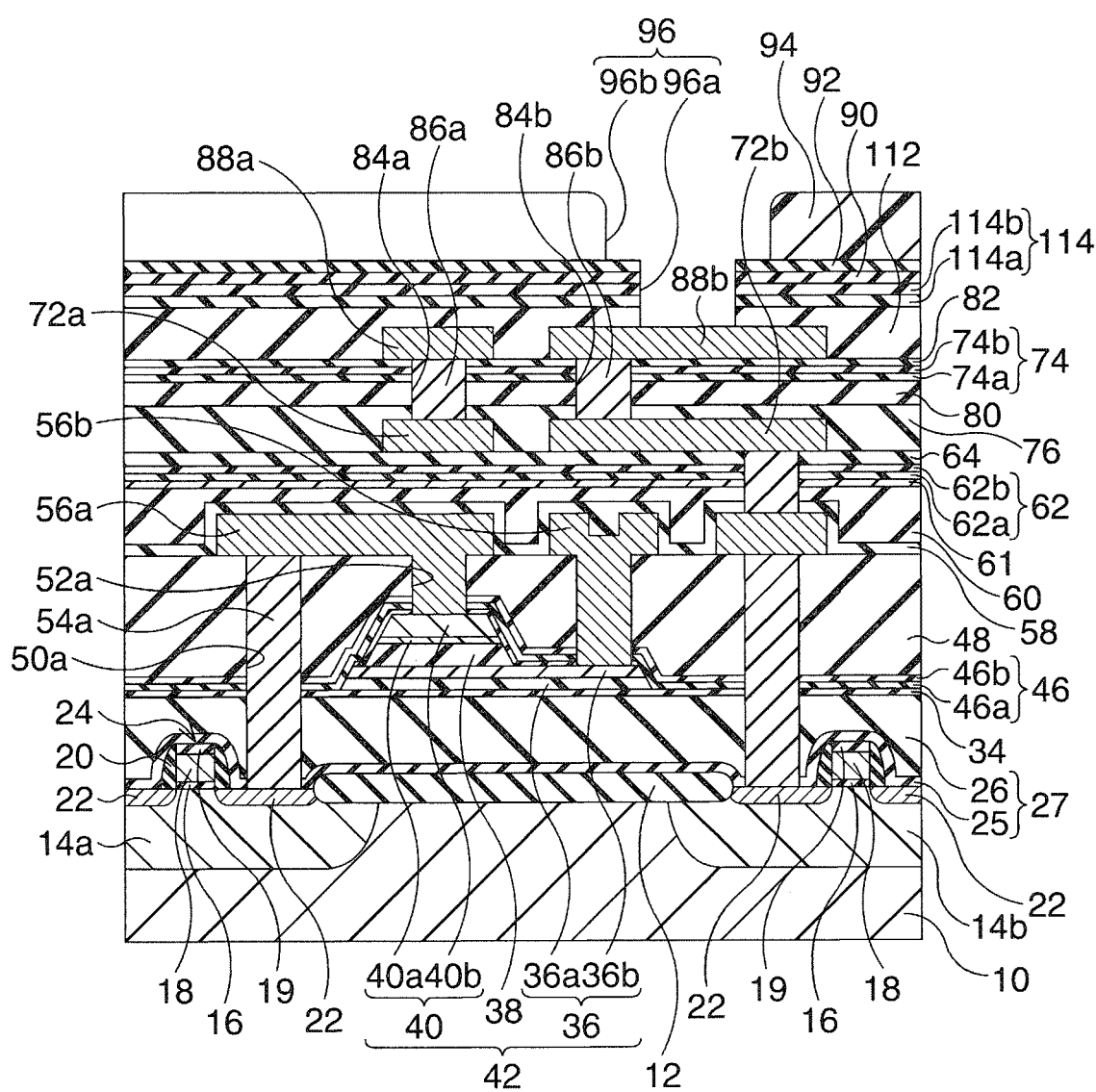
FIG. 10 is a cross-sectional view showing a ferroelectric memory according to a sixth embodiment.

Next, a sixth embodiment will be described. FIG. 10 is a cross-sectional view showing a ferroelectric memory (semiconductor device) according to the sixth embodiment.

In the fourth embodiment, the wirings 88a and 88b are directly covered by the silicon oxide film 90 and the silicon nitride film 92. On the other hand, in the sixth embodiment, a flat barrier film is provided between wirings 88a, 88b and a silicon oxide film 90/a silicon nitride film 92. Specifically, a planarized silicon oxide film 112 covering the wirings 88a and 88b is formed, and a barrier film 114 composed of an aluminum oxide film 114a and a titanium oxide film 114b is formed on the silicon oxide film 112. The silicon oxide film 90 and the silicon nitride film 92 are formed on the barrier film 114.

In manufacturing the semiconductor device according to the sixth embodiment, after processes up to the formation of the wirings 88a and 88b are performed in the same manner as in the fourth embodiment, the silicon oxide film 112 having a thickness of, for example, 1500 nm is formed on the entire surface by, for example, a plasma TEOSCVD method. Next, a surface of the silicon oxide film 112 is planarized by, for example, a CMP method. Then, thermal treatment in an atmosphere of plasma generated by using $N_2O$ gas or $N_2$ gas is performed, for example, at 350° C. for four minutes. As a result of the thermal treatment, moisture in the silicon oxide film 112 is removed, and the silicon oxide film 112 changes in property, which makes it difficult for moisture to enter the silicon oxide film 112. This thermal treatment nitrides the surface of the silicon oxide film 112, so that a SiON film (not shown) is formed on the surface of the silicon oxide film 112.

Next, the barrier film 114 is formed on the planarized silicon oxide film 112 by, for example, a sputtering method or a CVD method. In forming the barrier film 114, the titanium oxide film 114b is formed after the aluminum oxide film 114a is formed, similarly to the formation of the barrier film 74 and the like in the third embodiment. Since the barrier film 114 is formed on the flat silicon oxide film 112, the barrier film 114 becomes flat.

Thereafter, in the same manner as in the first embodiment, processes from the formation of the silicon oxide film 90 up to the formation of openings 96 are performed, thereby completing the semiconductor device.

(Seventh Embodiment)

Figure 11:
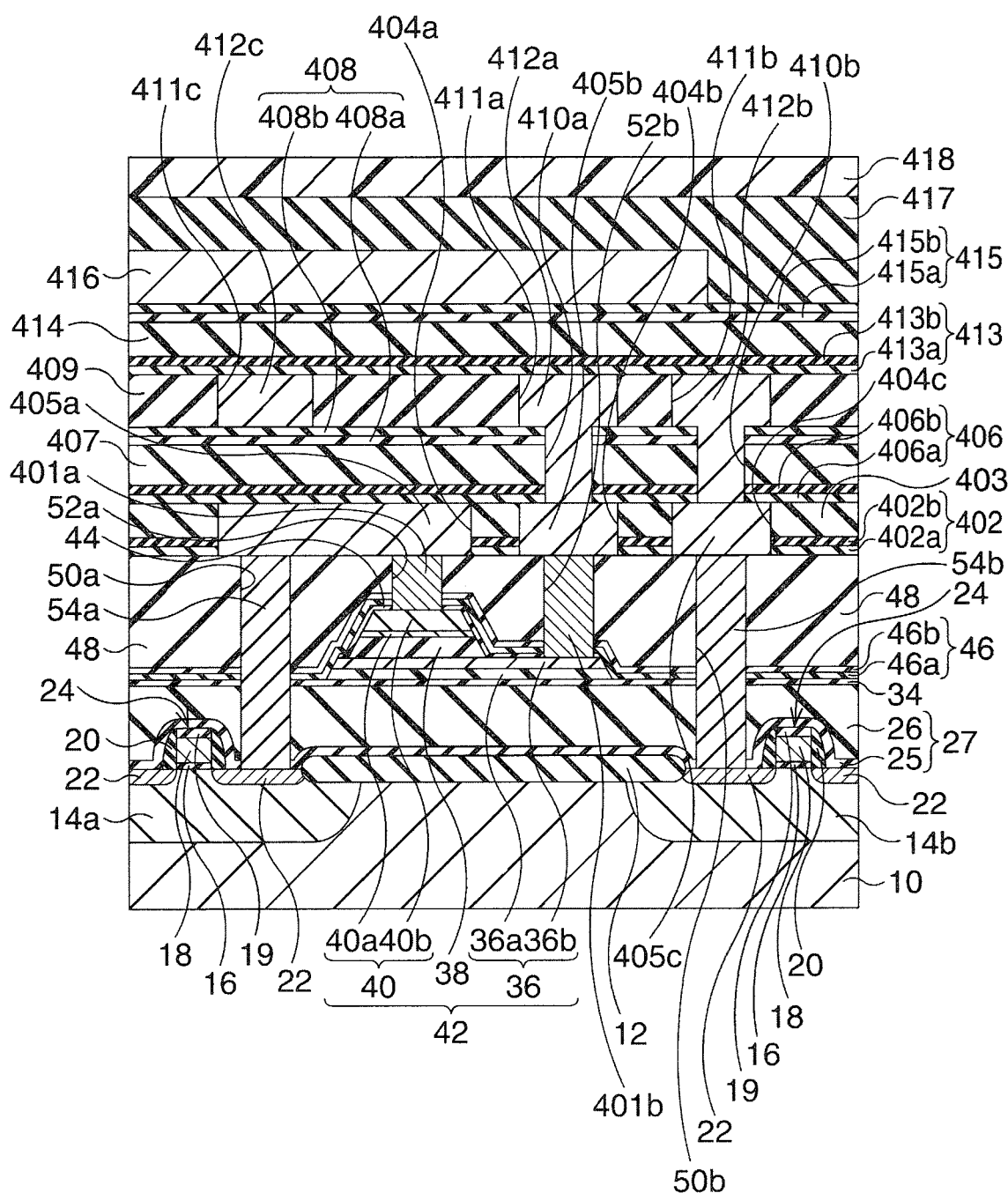
FIG. 11 is a cross-sectional view showing a ferroelectric memory according to a seventh embodiment.

Next, a seventh embodiment will be described. FIG. 11 is a cross-sectional view showing a ferroelectric memory (semiconductor device) according to the seventh embodiment.

In the seventh embodiment, conductive plugs 401a and 401b similar to the conductive plugs 54a and 54b are buried in contact holes 52a and 52b respectively. Except in this, the structure under an interlayer insulating film 48 is the same as the structure of the first embodiment.

Hereinafter, a wiring structure above the interlayer insulating film 48 will be described along with its forming method. In this embodiment, wirings are formed by adopting a dual damascene process. First, a barrier film 402 covering the interlayer insulating film 48, the conductive plugs 54a, 54b, 401a, and 402a is formed. In forming the barrier film 402, a titanium oxide film 402b is formed after an aluminum oxide film 402a is formed, similarly to the formation of the barrier film 58 and the like in the second embodiment. Next, a silicon oxide film 403 is formed on the barrier film 402 by, for example, a plasma TEOS method. Next, a surface of the silicon oxide film 403 is planarized by, for example, a CMP method. Then, thermal treatment in an atmosphere of plasma generated by using $N_2O$ gas or $N_2$ gas is performed, for example, at 350° C. for four minutes.

Next, the silicon oxide film 403 is patterned with the barrier film 402 used as an etching stopper, whereby wiring trenches 404a, 404b, and 404c are formed in the silicon oxide film 403. Subsequently, by etching the barrier film 402, the wiring trenches 404a are made to reach the conductive plugs 54a and 401a, the wiring trenches 404b are made to reach the conductive plugs 401b, and the wiring trenches 404c are made to reach the conductive plugs 54b.

Next, a barrier metal film composed of TaN is formed in the wiring trenches 404a, 404b, and 404c by, for example, a sputtering method. Next, a Cu film is formed by a plating method after a Cu seed layer (not shown) is formed by a sputtering method. Then, the Cu film, the Cu seed layer, and the barrier metal film are planarized by, for example, a CMP method until the silicon oxide film 403 is exposed, whereby wirings 405a, 405b, and 405c containing Cu are formed in the wiring trenches 404a, 404b, and 404c respectively.

Thereafter, a barrier film 406 covering the silicon oxide film 403 and the wirings 405a, 405b, and 405c is formed. In forming the barrier film 406, an titanium oxide film 406b is formed after an aluminum oxide film 406a is formed, similarly to the formation of the barrier film 402 and the like. Next, a silicon oxide film 407 is formed on the barrier film 406 by, for example, a plasma TEOS method. Next, a surface of the silicon oxide film 407 is planarized by, for example, a CMP method. Then, thermal treatment in an atmosphere of plasma generated by using $N_2O$ gas or $N_2$ gas is performed, for example, at 350° C. for four minutes.

Next, a barrier film 408 is formed on the silicon oxide film 407. In forming the barrier film 408, a titanium oxide film 408b is formed after an aluminum oxide film 408a is formed, similarly to the formation of the barrier film 402 and the like. Next, a silicon oxide film 409 is formed on the barrier film 408 by, for example, a plasma TEOS method. Next, a surface of the silicon oxide film 409 is planarized by, for example, a CMP method. Then, thermal treatment in an atmosphere of plasma generated by using $N_2O$ gas or $N_2$ gas is performed, for example, at 350° C. for four minutes.

Next, the silicon oxide film 409, the barrier film 408, and the silicon oxide film 407 are patterned with the barrier film 406 used as an etching stopper, thereby forming via holes 410a and 410b in these films. Subsequently, by etching the barrier film 406, the via holes 410a are made to reach the wirings 405b, and the via holes 410b are made to reach the wirings 405c. Next, the silicon oxide film 409 is patterned with the barrier film 408 used as an etching stopper, thereby forming wiring trenches 411a, 411b, and 411c in the silicon oxide film 409.

Next, a barrier metal film composed of TaN is formed in the wiring trenches 411a, 411b, and 411c, and in the via holes 410a and 410b by, for example, a sputtering method. Next, a Cu film is formed by a plating method after a Cu seed layer (not shown) is formed by a sputtering method. Then, the Cu film, the Cu seed layer, and the barrier metal film are planarized by, for example, a CMP method until the silicon oxide film 409 is exposed, whereby conductive layers 412a, 412b, and 412c serving as wirings and conductive plugs are formed.

Thereafter, a barrier film 413 covering the silicon oxide film 409 and the conductive layers 412a, 412b, and 412c is formed. In forming the barrier film 413, a titanium oxide film 413b is formed after an aluminum oxide film 413a is formed, similarly to the formation of the barrier film 402 and the like. Next, a silicon oxide film 414 is formed on the barrier film 413 by, for example, a plasma TEOS method. Next, a surface of the silicon oxide film 414 is planarized by, for example, a CMP method. Then, thermal treatment in an atmosphere of plasma generated by using $N_2O$ gas or $N_2$ gas is performed, for example, at 350° C. for four minutes. Subsequently, a barrier film 415 is formed on the silicon oxide film 414. In forming the barrier film 415, a titanium oxide film 415b is formed after an aluminum oxide film 415a is formed, similarly to the formation of the barrier film 402 and the like.

Thereafter, global wiring parts 416, a silicon oxide film 417, and a protective layer 418 are formed on the barrier film 415. Then, by forming pad openings (not shown), the semiconductor device is completed.

In a case where the dual damascene method is thus adopted, it is also possible to easily form via holes and the like in a desired shape while ensuring a high barrier effect. In a case where a single damascene method is adopted, it is also possible to obtain the same effects.

(Eighth Embodiment)

Next, an eighth embodiment will be described. In the first to seventh embodiments, the structure of the ferroelectric capacitors 42 is of a planar type, on the other hand, in the eighth embodiment, ferroelectric capacitors whose structure is of a stacked type are provided. Hereinafter, the eighth embodiment will be described in detail, and for convenience sake, its cross-sectional structure will be described along with its manufacturing method. FIG. 12A to FIG. 12D are cross-sectional views showing a method for manufacturing a ferroelectric memory (semiconductor device) according to the eighth embodiment, in order of processes.

Figure 12A:
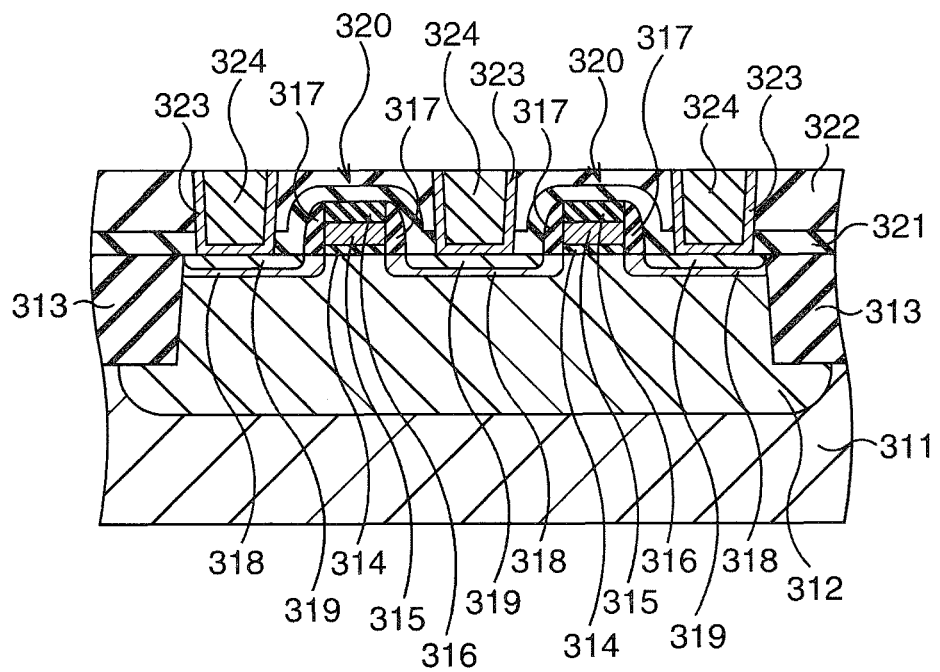
FIG. 12A is a cross-sectional view showing a method for manufacturing a ferroelectric memory according to an eighth embodiment, in order of processes.

In this embodiment, as shown in FIG. 12A, wells 312 are first formed in a surface of a semiconductor substrate 311 such as a silicon substrate. Element isolation regions 313 are formed on the surface of the semiconductor substrate 311 by, for example, STI (shallow trench isolation). Subsequently, gate insulating films 314, gate electrodes 315, cap films 316, sidewalls 317, source/drain diffusion layers 318, and silicide layers 319 are formed on surfaces of the wells 312, whereby MOS transistors 320 as switching elements are formed. The MOS transistors 320 correspond to the MOS transistors 2 in FIG. 1. In each of the MOS transistors 320, the two source/drain diffusion layers 318 for a source and a drain are formed, and one of them is shared by the two MOS transistors 320.

Next, a silicon oxynitride film 321 (thickness: 200 nm) is formed on the entire surface so as to cover the MOS transistors 320, and a silicon oxide film 322 (thickness: 1000 nm) is further formed on the entire surface as an interlayer insulating film and is planarized by CMP (chemical mechanical polishing) or the like. The silicon oxynitride film 321 is formed in order to prevent hydrogen deterioration of the gate insulating films 314 and so on that occurs when the silicon oxide film 322 is formed. Thereafter, contact holes reaching the silicide layers 319 are formed in the silicon oxide film 322 and the silicon oxynitride film 321, whereby plug contact parts are opened. Then, after a glue film 323 is formed in the contact holes, a W film is buried by, for example, a CVD method and is planarized by CMP, whereby conductive plugs 324 are formed.

Figure 12B:
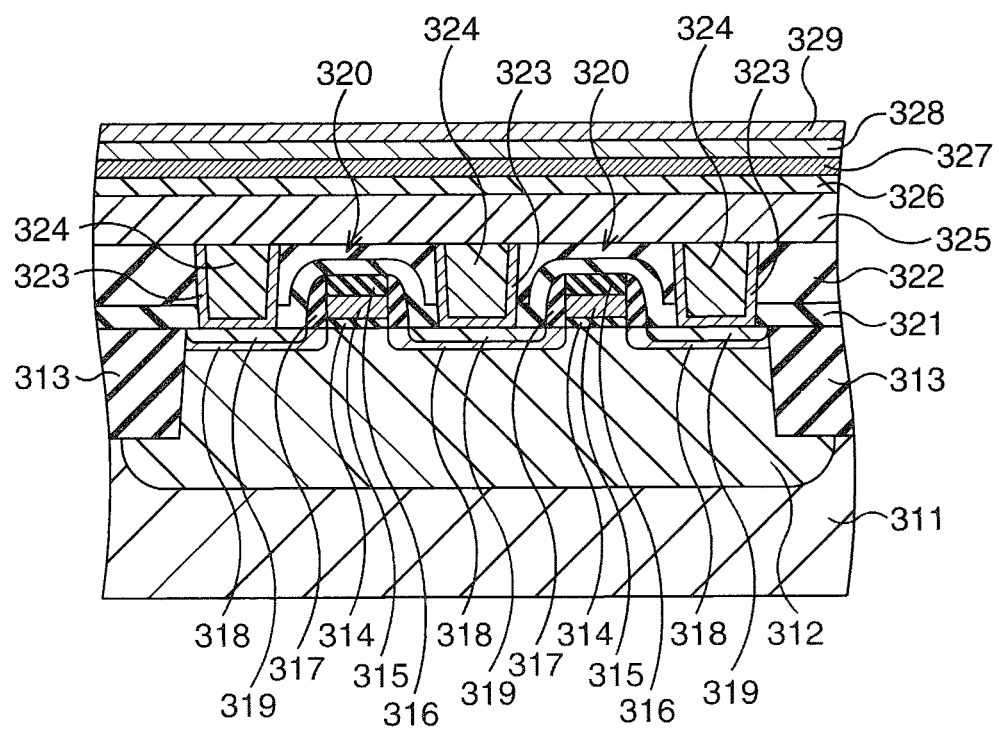
FIG. 12B is a cross-sectional view showing the method for manufacturing a ferroelectric memory, in order of processes, following FIG. 12A.

Subsequently, as shown in FIG. 12B, an iridium film 325 is formed on the silicon oxide film 322 by, for example, a sputtering method. As conditions at this time, for example, substrate temperature is set to 500° C., deposition power is set to 1 kW, flow rate of Ar gas is set to 100 sccm, pressure in a chamber is set to 0.35 Pa, and deposition time is set to 176 seconds. As a result, the iridium film 325 with an about 250 nm thickness is obtained.

Next, an iridium oxide film 326 is formed on the iridium film 325 by, for example, a sputtering method. As conditions at this time, for example, substrate temperature is set to 50° C., deposition power is set to 1 kW, flow rate of Ar gas is set to 60 sccm, flow rate of $O_2$ gas is set to 60 sccm, pressure in a chamber is set to 0.37 Pa, and deposition time is set to 10 seconds. As a result, the iridium oxide film 326 with an about 28 nm thickness is obtained.

Next, a platinum film 327 is formed on the iridium oxide film 326 by, for example, a sputtering method. As conditions at this time, for example, substrate temperature is set to 350° C., deposition power is set to 1 kW, flow rate of Ar gas is set to 100 sccm, pressure in a chamber is set to 0.38 Pa, and deposition time is set to 8 seconds. As a result, the platinum film 327 with an about 15 nm thickness is obtained.

Thereafter, a platinum oxide film 328 is formed on the platinum film 327 by, for example, a sputtering method. As conditions at this time, for example, substrate temperature is set to 350° C., deposition power is set to 1 kW, flow rate of Ar gas is set to 36 sccm, flow rate of $O_2$ gas is set to 144 sccm, pressure in a chamber is set to 6.2 Pa, and deposition time is set to 22 seconds. As a result, the platinum oxide film 328 with an about 25 nm thickness is obtained. Then, a platinum film 329 is formed on the platinum oxide film 328 by, for example, a sputtering method. As conditions at this time, for example, substrate temperature is set to 100° C., deposition power is set to 1 kW, flow rate of Ar gas is set to 100 sccm, pressure in a chamber is set to 0.4 Pa, and deposition time is set to 32 seconds. As a result, the platinum film 329 with an about 50 nm thickness is obtained.

These iridium film 325, iridium oxide film 326, platinum film 327, platinum oxide film 328, and platinum film 329 constitute a barrier metal film and a bottom electrode film. As the barrier metal film and the bottom electrode film, any of the following film stacks may be used. For example, (a) a film stack in which a Ti film is formed on an Ir film, (b) a film stack in which a Ti film and a TiAlN film are formed in sequence on an Ir film, (c) a film stack in which a Ti film is formed on a Pt film, (d) a film stack in which an IrO$_2$ film is formed on a Pt film, (e) a film stack in which a RuO$_2$ film is formed on a Pt film, (f) a film stack in which a LSCO((La$_{1-x}$Sr$_x$)CuO$_3$) film is formed on a Pt film, (g) a film stack in which a Ti film and a TiAlN film are formed in sequence on a Pt film, and the like. That is, usable is a single-layer conductive film or a multilayer conductive film of metal or a metal oxide containing at least one kind selected from a group consisting of Pt, Ir, Ru, Rh, Re, Os, Pd, SrRuO$_3$, and TiAlN.

Figure 12C:
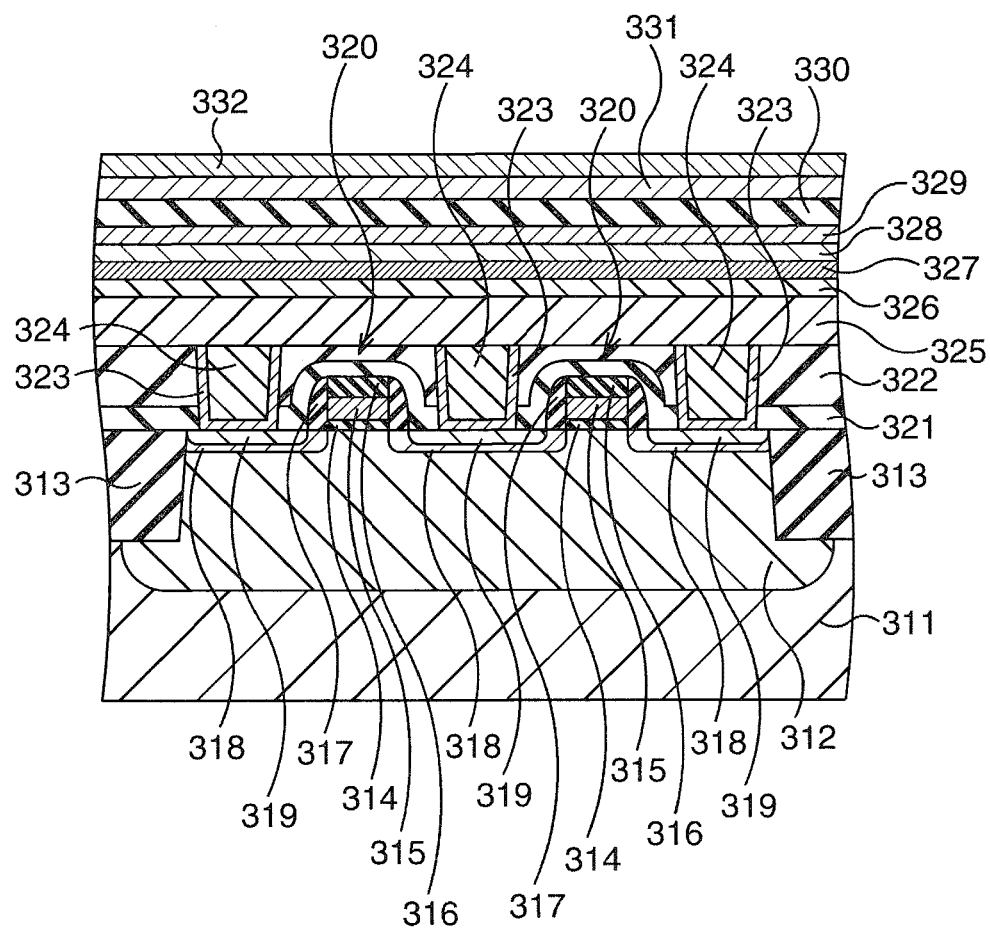
FIG. 12C is a cross-sectional view showing the method for manufacturing a ferroelectric memory, in order of processes, following FIG. 12B.

60-second rapid thermal annealing (RTA) in an Ar atmosphere at, for example, 750° C. follows the formation of the above film stack, thereby crystallizing the platinum film 329. Next, as shown in FIG. 12C, a ferroelectric film, for example, a PLZT((Pb, La) (Zr, Ti)O$_3$) film 330 is formed on the platinum film 329 by, for example, a sputtering method, and is subjected to annealing for crystallization. The PLZT film 330 can also be formed by, for example, a MOCVD method, but in a case where the MOCVD method is used, the structure of the bottom electrode film is desirably changed to a different structure.

After the annealing for crystallization, a top electrode film 331 is formed on the PLZT film 330 by sputtering. The top electrode film 331 is composed of, for example, two layers of iridium oxide films different in composition. In forming the first iridium oxide film, for example, substrate temperature is set to room temperature, deposition power is set to 2 kW, flow rate of Ar gas is set to 100 sccm, and flow rate of O$_2$ gas is set to 59 sccm. The first iridium oxide film has an about 50 nm thickness, for instance. Annealing follows the formation of the first iridium oxide film, and thereafter, the second iridium oxide film is formed. The second iridium oxide film has an about 75 nm to about 125 nm thickness, for instance. Subsequently, a rear surface (back surface) of the semiconductor substrate (wafer) 311 is cleaned.

Then, an iridium adhesive film (mask adhesive film) 332 is formed on the top electrode film 331 by, for example, a sputtering method. As conditions at this time, for example, substrate temperature is set to 400° C. or higher, flow rate of Ar gas is set to 100 sccm, deposition power is set to 1 kW, and deposition time is set to 7 seconds. As a result, the iridium adhesive film 332 with an about 10 nm thickness is formed. After the iridium adhesive film 332 is formed, a titanium nitride film (not shown) and a silicon oxide film (not shown) using TEOS are formed in sequence, the titanium nitride film and the silicon oxide film being used as a hard mask when the top electrode film 331, the PLZT film 330, the platinum film 329, the platinum oxide film 328, the platinum film 327, the iridium oxide film 326, and the iridium film 325 are patterned. The titanium nitride film is formed at, for example, 20020 C. and has an about 200 nm thickness. The silicon oxide film is formed at, for example, 390° C. and has an about 390 nm thickness.

Figure 12D:
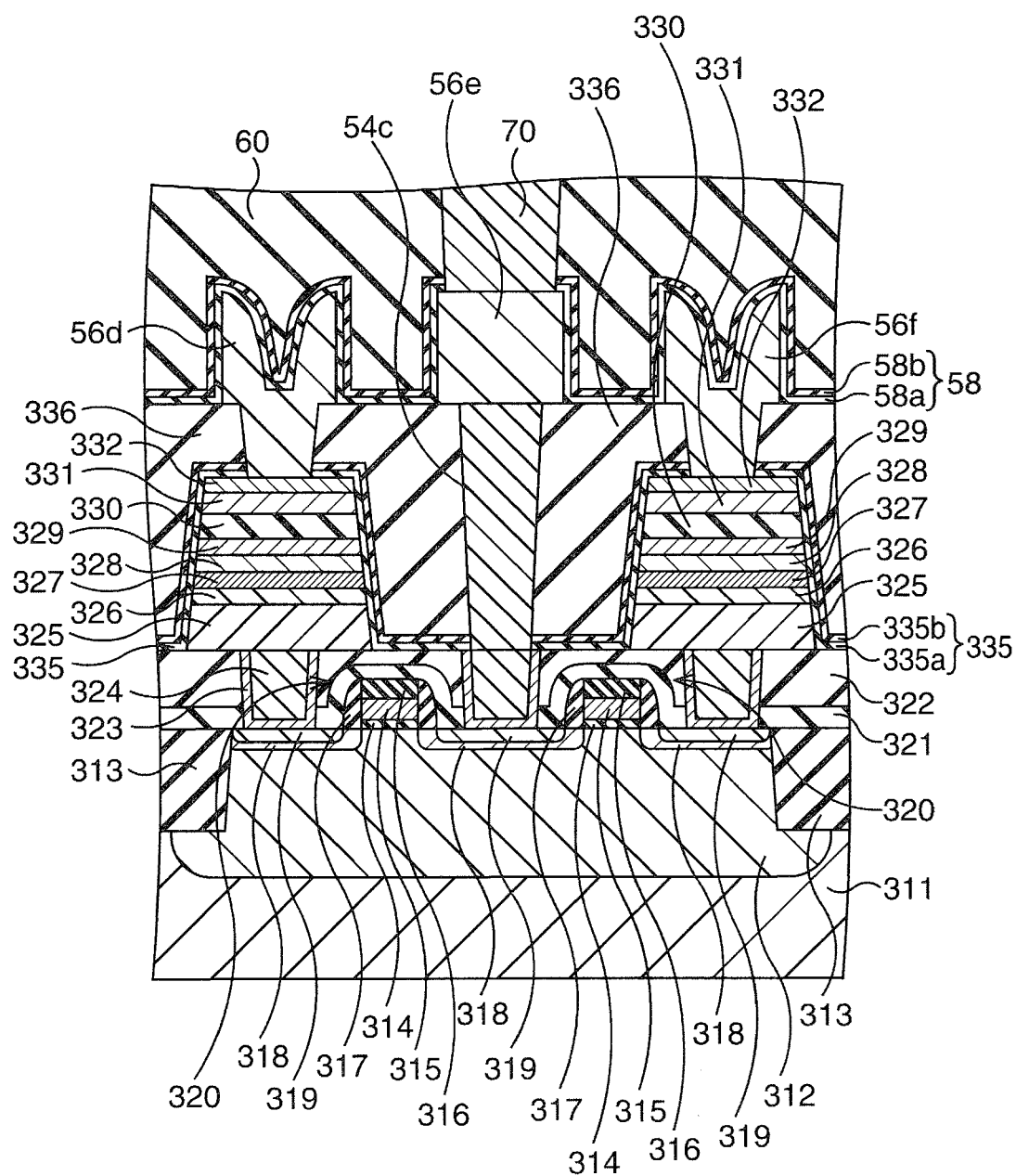
FIG. 12D is a cross-sectional view showing the method for manufacturing a ferroelectric memory, in order of processes, following FIG. 12C.

Next, the silicon oxide film and the titanium nitride film are patterned, thereby forming a hard mask only on a region where the ferroelectric capacitors of a stack type are intended to be formed. Next, the iridium adhesive film 332, the top electrode film 331, the PLZT film 330, the platinum film 329, the platinum oxide film 328, the platinum film 327, the iridium oxide film 326, and the iridium film 325 are processed at a time by using patterning and etching with the silicon oxide film and the titanium nitride film used as the hard masks, so that the ferroelectric capacitors with a stack structure are formed as shown in FIG. 12D. The ferroelectric capacitors correspond to the ferroelectric capacitors 1 in FIG. 1. Thereafter, the hard mask (the silicon oxide film and the titanium nitride film) is removed. Then, thermal treatment is performed, for example, at 300° C. to 500° C. for 30 minutes to 120 minutes.

Next, a barrier film 335 is formed on the entire surface by, for example, a sputtering method or a CVD method. In forming the barrier film 335, an aluminum oxide film 335a having a thickness of, for example, 20 nm is first formed by, for example, a sputtering method or a CVD method. Then, there follows recovery annealing for recovering a damage to the PLZT film 330 due to the film deposition, the etching process, and so on. For example, thermal treatment is performed at 500° C. to 700° C. for 30 minutes to 120 minutes in an oxygen atmosphere. Next, a titanium oxide film 335b having a thickness of, for example, 20 nm to 100 nm is formed on the aluminum oxide film 335a by, for example, a sputtering method or a CVD method. In forming the titanium oxide film 335b, after a metallic titanium film is formed by a sputtering method, the metallic titanium film may be oxidized by annealing in an oxygen atmosphere, for example, at 300° C. to 700° C. for one minute to 120 minutes.

Next, an interlayer insulating film 336 is formed on the entire surface and this interlayer insulating film 336 is planarized by CMP. Thereafter, contact holes reaching the conductive plugs 324 are formed in the interlayer insulating film 336 and the barrier film 335 by using a patterning and etching technique.

In a case where only an aluminum oxide film is formed as the barrier film 335 and this aluminum oxide film is made thick for enhanced moisture resistance, it is difficult to process the aluminum oxide film and thus it is difficult to form the contact holes into a desired shape. On the other hand, in this embodiment, the titanium oxide film 335b is formed as a part of the barrier film 335 and this titanium oxide film 335b easily reacts with etching gas (for example, chlorine or fluorine). Further, since the titanium oxide film 335b can also exhibit a barrier effect, the aluminum oxide film 335a may be thin. The thin aluminum oxide film 335a can be easily sputter-etched with argon gas. Therefore, in this embodiment, the contact holes in a desired shape can be easily formed.

Thereafter, in the same manner as the formation of the conductive plugs 54a and 54b in the first embodiment, conductive plugs 54c are formed, and in the same manner as the formation of the wirings 56a, 56b, and 56c, wirings 56d, 56e, and 56f are formed. Subsequently, in the same manner as in the second embodiment, a barrier film 58 covering the wirings 56d, 56e, and 56f is formed. That is, the barrier film 58 composed of an aluminum oxide film 58a and a titanium oxide film 56b is formed. Incidentally, the wirings 56d and 56f connected to the ferroelectric capacitors are connected to the plate lines, and the wirings connected to the MOS transistors 320 via the conductive plugs 54c are connected to the bit lines. Thereafter, in the same manner as in the second embodiment, processes from the formation of a silicon oxide film 60 up to the formation of openings 96 (not shown in FIG. 12A to FIG. 12D) are performed, thereby completing the semiconductor device.

In the embodiment applied to such a ferroelectric capacitor of a stack type, the contact holes in a desired shape can be easily formed as in the first embodiment and so on. Further, a sufficient barrier effect can also be obtained. Therefore, yields are increased and life under severer conditions is increased.

(Ninth Embodiment)

Figure 13:
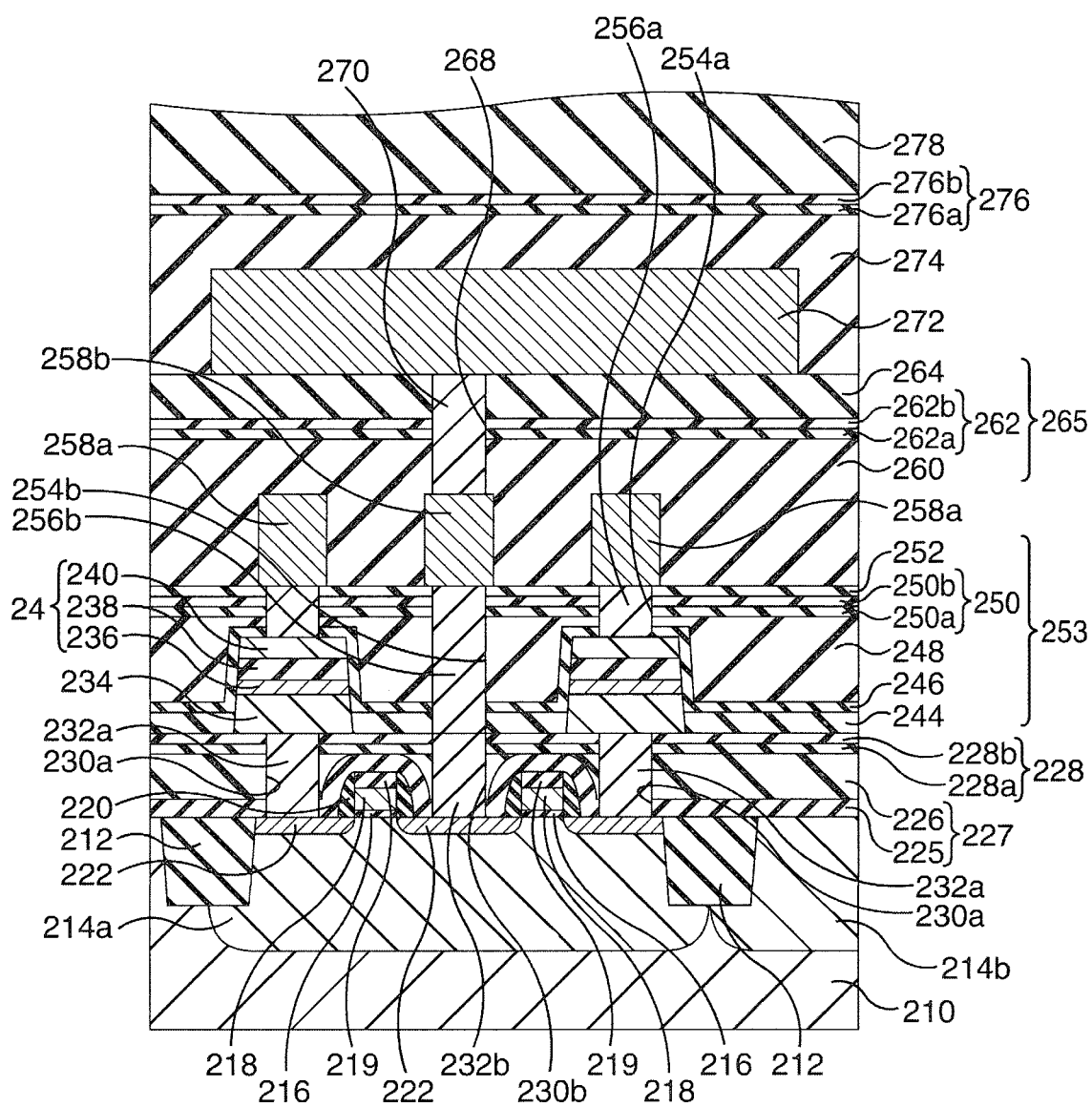
FIG. 13 is a cross-sectional view showing a ferroelectric memory according to a ninth embodiment.

Next, a ninth embodiment will be described. FIG. 13 is a cross-sectional view showing a ferroelectric memory (semiconductor device) according to the ninth embodiment.

In this embodiment, element isolation regions 212 defining element regions are formed on a semiconductor substrate 210 composed of, for example, silicon. In the semiconductor substrate 210 to which the element isolation regions 212 are formed, wells 214a and 214b are formed. Further, on the semiconductor substrate 210, gate electrodes (gate wirings) 218 are formed via gate insulating films 216. Each of the gate electrodes 218 has, for example, a polycide structure in which a metal silicide film such as a cobalt silicide film, a nickel silicide film, or a tungsten silicide film is stacked on a polysilicon film according to a gate length or the like of a transistor. On each of the gate electrodes 218, a silicon oxide film 219 is formed. A sidewall insulating film 220 is formed on a sidewall portion of the gate electrode 218 and the silicon oxide film 219. On both sides of each of the gate electrodes 218, source/drain diffusion layers 222 are formed. In this manner, transistors 224 each having the gate electrode 218 and the source/drain diffusion layers 222 are structured. The gate length of each of the transistors 224 is set to, for example, 0.18 µm.

On the semiconductor substrate 210, a silicon oxynitride film 225 and a silicon oxide film 226 covering the transistors 224 are sequentially formed. The silicon oxynitride film 225 and the silicon oxide film 226 constitute an interlayer insulating film 227. A surface of the interlayer insulating film 227 is planarized. A barrier film 228 is formed on the interlayer insulating film 227. The barrier film 228 is composed of an aluminum oxide film 228a and a titanium oxide film 228b. In forming the barrier film 228, the titanium oxide film 228b may be formed after the aluminum oxide film 228a is formed, similarly to the formation of the barrier film 58 of the second embodiment.

Contact holes 230a and 230b reaching the source/drain diffusion layers 222 are formed in the barrier film 228 and the interlayer insulating film 227. In the contact holes 230a and 230b, a barrier metal film (not shown) is formed. This barrier metal film is structured such that a TiN film is formed on a Ti film. Further, in the contact holes 230a and 230b, conductive plugs 232a and 232b containing tungsten are buried respectively.

An Ir film 234 electrically connected to each of the conductive plugs 232a is formed on the barrier film 228. A bottom electrode 236 is formed on the Ir film 234. A ferroelectric film 238 is formed on the bottom electrode 236. As the ferroelectric film 238, for example, a PZT film is used. A top electrode 240 is formed on the ferroelectric film 238. The bottom electrode 236, the ferroelectric film 238, and the top electrode 240 constitute each ferroelectric capacitor 242. These top electrodes 240, ferroelectric films 238, bottom electrodes 236, and Ir films 234 are patterned at a time by etching and have substantially the same shape in a plane view. Further, the bottom electrodes 236 of the ferroelectric capacitors 242 are electrically connected to the conductive plugs 232a via the Ir films 234.

On a region, of the interlayer insulating film 227, where the Ir films 234 are not formed, a silicon oxynitride film 244 substantially equal in thickness to the Ir film 234 or smaller in thickness than the Ir film 234 is formed. Incidentally, a silicon oxide film may be formed instead of the silicon oxynitride film 244. On the ferroelectric capacitors 242 and on the silicon oxynitride film 244, a barrier film 246 having a function of preventing diffusion of hydrogen and moisture is formed. As the barrier film 246, for example, an aluminum oxide film is used. A silicon oxide film 248 is formed on the barrier film 246, and the ferroelectric capacitors 242 are buried in the silicon oxide film 248. A surface of the silicon oxide film 248 is planarized.

On the planarized silicon oxide film 248, a flat barrier film 250 having a function of preventing diffusion of hydrogen and moisture is formed. The barrier film 250 is composed of an aluminum oxide film 250a and a titanium oxide film 250b. In forming the barrier film 250, the titanium oxide film 250b may be formed after the aluminum oxide film 250a is formed, similarly to the formation of the barrier film 58 in the second embodiment. On the barrier film 250, a silicon oxide film 252 is formed. The silicon oxynitride film 244, the barrier film 246, the silicon oxide film 248, the barrier film 250, and the silicon oxide film 252 constitute an interlayer insulating film 253.

Contact holes 254a reaching the top electrodes 240 are formed in the silicon oxide film 252, the barrier film 250, the silicon oxide film 248, and the barrier film 246. Further, contact holes 254b reaching the conductive plugs 232b are formed in the silicon oxide film 252, the barrier film 250, the silicon oxide film 248, the barrier film 246, and the silicon oxynitride film 244. In the contact holes 254a and 254b, a barrier metal film (not shown) is formed. The barrier metal film is composed of a Ti film and a TiN film formed on the Ti film, or is comprised only of a TiN film.

In the contact holes 254a and 254b, conductive plugs 256a and 256b containing tungsten are buried respectively. On the silicon oxide film 252, wirings 258a electrically connected to the conductive plugs 256a and wirings 258b electrically connected to the conductive plugs 256b are formed. On the silicon oxide film 252, a silicon oxide film 260 covering the wirings 258a and 258b are formed. A surface of the silicon oxide film 260 is planarized.

On the planarized silicon oxide film 260, a flat barrier film 262 having a function of preventing diffusion of hydrogen and moisture is formed. The barrier film 262 is composed of an aluminum oxide film 262a and a titanium oxide film 262b. In forming the barrier film 262, the titanium oxide film 262b may be formed after the aluminum oxide film 262a is formed, similarly to the formation of the barrier film 58 in the second embodiment. Further, on the barrier film 262, a silicon oxide film 264 is formed. The silicon oxide film 260, the barrier film 262, and the silicon oxide film 264 constitute an interlayer insulating film 265.

Contact holes 268 reaching the wirings 258b are formed in the silicon oxide film 264, the barrier film 262, and the silicon oxide film 260. A barrier metal film (not shown) is formed in the contact holes 268. The barrier metal film is composed of a Ti film and a TiN film formed on the Ti film. Further, in the contact holes 268, conductive plugs 270 containing tungsten are buried. Further, wirings 272 electrically connected to the conductive plugs 268 are formed on the silicon oxide film 264. Further, a silicon oxide film 274 covering the wirings 272 are formed on the silicon oxide film 264. A surface of the silicon oxide film 274 is planarized.

On the planarized silicon oxide film 274, a flat barrier film 276 having a function of preventing diffusion of hydrogen and moisture is formed. The barrier film 276 is composed of an aluminum oxide film 276a and a titanium oxide film 276b. In forming the barrier film 276, the titanium oxide film 276b may be formed after the aluminum oxide film 276a is formed, similarly to the formation of the barrier film 58 in the second embodiment. Further, a silicon oxide film 278 is formed on the barrier film 276. Wirings and so on, though not shown, are formed on the silicon oxide film 278 as necessary.

In the ninth embodiment described above, the contact holes in a desired shape can be easily formed as in the first embodiment and so on. Further, a sufficient barrier effect can be also obtained. Therefore, yields are improved and life under severer conditions is increased. Incidentally, if, as the barrier film 246, a barrier film composed of an aluminum oxide film and a titanium oxide film is used, processing for forming the contact holes is further facilitated.

In the present embodiment, films constituting the barrier film are not limited to the aluminum oxide film and the titanium oxide film. For example, usable are an Al nitride film, an Al oxynitride film, a Ta oxide film, a Ta nitride film, a Zr oxide film, and the like. It should be noted that, as a lower-side film, an Al oxide film, an Al nitride film, and an Al oxynitride film are preferable, and as an upper-side film, a Ti oxide film, a Ta oxide film, a Ta nitride film, and a Zr oxide film are preferable. Further, the barrier film directly covering the ferroelectric capacitors may be composed of a single film, providing that the upper barrier film is a film stack.

Further, the crystal structure of a substance forming the ferroelectric film is not limited to a perovskite structure, and may be, for example, a Bi layered structure. Further, the composition of the substance forming the ferroelectric film is not specifically limited. For example, Pb (lead), Sr (strontium), Ca (calcium), Bi (bismuth), Ba (barium), Li (lithium), and/or Y (yttrium) may be contained as an acceptor element, and Ti (titanium), Zr (zirconium), Hf (hafnium), V (vanadium), Ta (tantalum), W (tungsten), Mn (manganese), Al (aluminum), Bi (bismuth) and/or Sr (strontium) may be contained as a donor element.

Examples of a chemical formula of the substance forming the ferroelectric film are $Pb(Zr, Ti)O_3$, $(Pb, Ca) (Zr, Ti)O_3$, $(Pb, Ca) (Zr, Ti, Ta)O_3$, $(Pb, Ca) (Zr, Ti, W)O_3$, $(Pb, Sr) (Zr, Ti)O_3$, $(Pb, Sr) (Zr, Ti, W)O_3$, $(Pb, Sr) (Zr, Ti, Ta)O_3$, $(Pb, Ca, Sr) (Zr, Ti)O_3$, $(Pb, Ca, Sr) (Zr, Ti, W)O_3$, $(Pb, Ca, Sr) (Zr, Ti, Ta)O_3$, $SrBi_2Ta_2O_9$, $Bi_4Ti_3O_9$, and $BaBi_2Ta_2O_9$, but the chemical formula is not limited to these. Further, Si may be added to these.

The compositions of the top electrode and the bottom electrode are not specifically limited, either. The bottom electrode may be composed of, for example, Pt (platinum), Ir (iridium), Ru (ruthenium), Rh (rhodium), Re (rhenium), Os (osmium) and/or Pd (palladium), and may be composed of an oxide of any of these. The top electrode may be composed of, for example, an oxide of Pt, Ir, Ru, Rh, Re, Os and/or Pd. Further, the top electrode may be composed of a plurality of stacked films.

The structure of each cell of the ferroelectric memory is not limited to a 1T1C type, but may be a 2T2C type. Further, in the ferroelectric memory, the ferroelectric capacitor itself may serve both as a storage part and a switching part. The structure in this case is such that the ferroelectric capacitor is formed instead of the gate electrode of the MOS transistor. That is, the ferroelectric capacitor is formed on the semiconductor substrate via a gate insulating film.

The method for forming the ferroelectric film is not specifically limited. Examples of adoptable methods are a sol-gel method, a MOD (Metal Organic Decomposition) method, a CSD (Chemical Solution Deposition) method, a CVD (Chemical Vapor Deposition) method, an epitaxial growth method, a sputtering method, a MOCVD (Metal Organic Chemical Vapor Deposition) method, and the like.

Incidentally, the patent document 1 (Japanese Patent Application Laid-open No. 2002-176149) names, as a barrier film, an aluminum oxide film, an aluminum nitride film, and a titanium oxide film, and so on. However, even if any of these films is used independently, it is difficult to realize both high processing accuracy and a sufficient barrier effect.

Further, the patent document 2 (Japanese Patent Application Laid-open No. 2004-71932) describes a structure in which an aluminum oxide film, a silicon oxide film formed by using TEOS, and an aluminum oxide film are stacked so as to cover ferroelectric capacitors. In this structure, since a large amount of moisture is discharged from the silicon oxide film formed by using TEOS, deterioration and peeling of the ferroelectric capacitors may possibly occur.

Further, the patent document 3 (Japanese Patent Application Laid-open No. 2001-111007) discloses a method in which an aluminum oxide film is formed by an ALD (Atomic Layer Deposition) method or the like after a titanium oxide film and so on covering ferroelectric capacitors is formed by an ALD method or the like in order to obtain favorable coverage. However, if these films are formed by the ALD method, the ferroelectric capacitors are deteriorated due to the occurrence of damage and a chemical reaction.

Figure 14A:
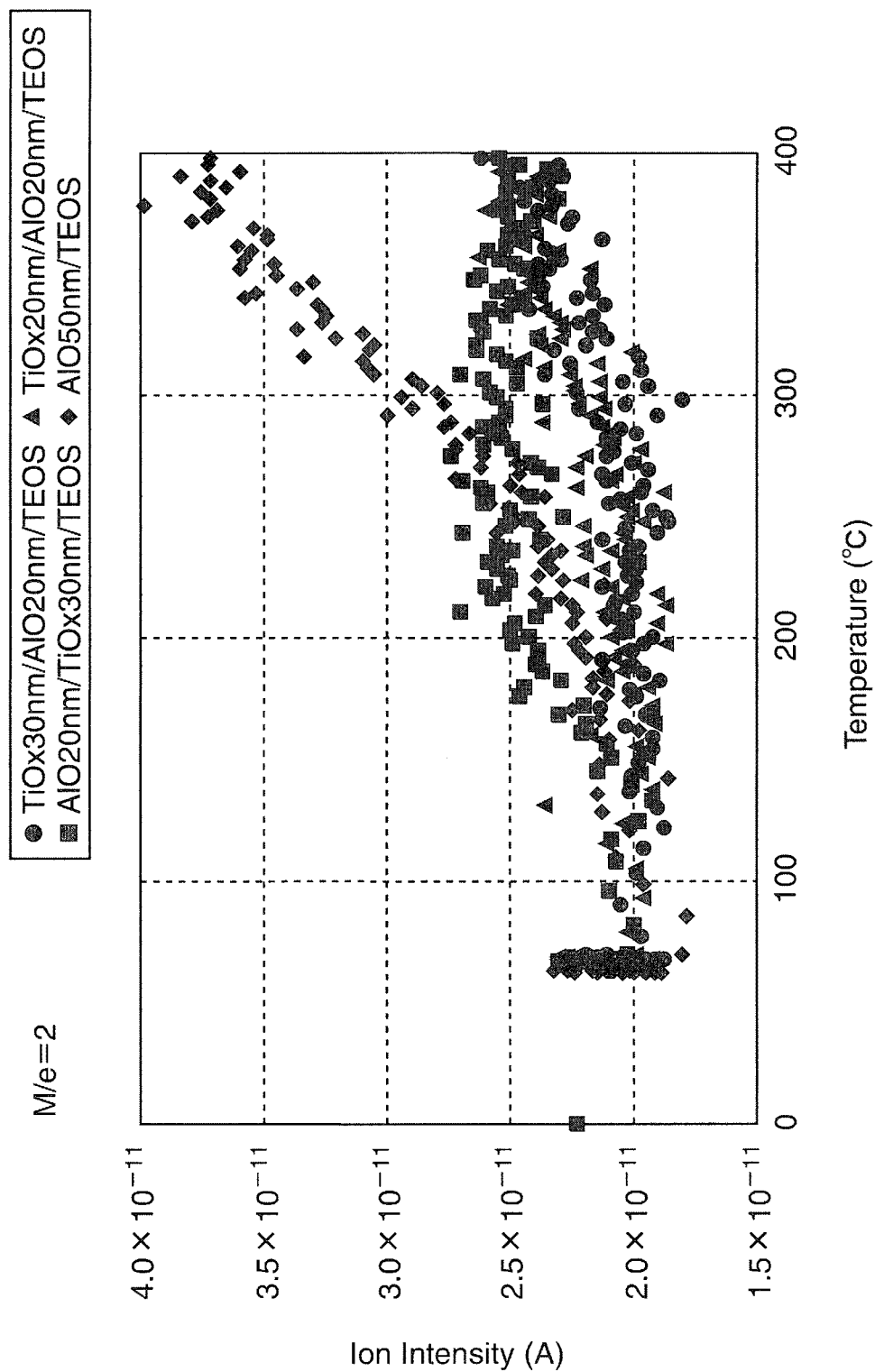
FIG. 14A is a graph showing results of TDS analysis of a substance ($H_2$) whose molecular weight is 2, in an art described in the patent document 3.

In the patent document 3, the aluminum oxide film is formed on the titanium oxide film, but in this structure, amounts of hydrogen and moisture greatly increase at about 200° C. as shown in FIG. 14A and FIG. 14B. In particular, the characteristic against water is poorer than that of a single layer of an aluminum oxide film. On the other hand, in the present embodiment, the titanium oxide film is formed on the aluminum oxide film. Consequently, generation amounts of hydrogen and water are reduced. In the ferroelectric memory, various kinds of high-temperature thermal treatments such as recovery annealing follow the formation of the barrier films, and consequently, the characteristic of the barrier films at about 200° C. appear in the course of each of the treatments. Reducing the generation of water or hydrogen at about 200° C. leads to the realization of a ferroelectric memory having a good characteristic.

The foregoing tendency is also observed in a barrier film composed of any of an aluminum nitride film and an aluminum oxynitride film other than an aluminum oxide film, and using an Al-containing film on a lower-layer side results in a better characteristic of the whole barrier film. This also applies to a case where an upper-layer side film is any of a tantalum oxide film, a zirconium oxide film, and a tantalum nitride film other than a titanium oxide film. It should be noted that the combination of the aluminum oxide film and the titanium oxide film exhibited the best barrier characteristic. The numbers provided to the embodiments have nothing to do with the importance of the invention.

Industrial Applicability

As has been described in detail, it may be possible to improve processing accuracy of contact holes while maintaining a barrier effect. Therefore, it may be possible to improve yields and to lengthen the life and expand a usable temperature range.

What is claimed is:

1. A semiconductor device comprising:
   a ferroelectric capacitor formed over a semiconductor substrate;
   a first barrier film covering the ferroelectric capacitor;
   a second barrier film formed over the ferroelectric capacitor;
   a wiring connected to the ferroelectric capacitor;
   a third barrier film formed at a position higher than the wiring,
   a second wiring formed over the wiring and the third barrier film and connected with the wiring; and
   a fourth barrier film formed at a position higher than the second wiring,
   wherein the first barrier film is a film stack whose lower layer is one kind of film selected from a group consisting of an aluminum oxide film, an aluminum nitride film, and an aluminum oxynitride film, and whose upper layer is one kind of film selected from a group consisting of a titanium oxide film, a tantalum oxide film, a zirconium oxide film, and a tantalum nitride film, wherein the second barrier film is a film stack whose lower layer is one kind of film selected from a group consisting of an aluminum oxide film, an aluminum nitride film, and an aluminum oxynitride film, and whose upper layer is one kind of film selected from a group consisting of a titanium oxide film, a tantalum oxide film, a zirconium oxide film, and a tantalum nitride film, wherein the third barrier film is a film stack whose lower layer is one kind of film selected from a group consisting of an aluminum oxide film, an aluminum nitride film, and an aluminum oxynitride film, and whose upper layer is one kind of film selected from a group consisting of a titanium oxide film, a tantalum oxide film, a zirconium oxide film, and a tantalum nitride film, wherein the fourth barrier film is a film stack whose lower layer is one kind of film selected from a group consisting of an aluminum oxide film, an aluminum nitride film, and an aluminum oxynitride film, and whose upper layer is one kind of film selected from a group consisting of a titanium oxide film, a tantalum oxide film, a zirconium oxide film, and a tantalum nitride film.

2. The semiconductor device according to claim 1, wherein the third barrier film is the film stack directly covering the wiring.

3. The semiconductor device according to claim 1, wherein at least a part of the wiring contains copper and has a damascene structure.

4. The semiconductor device according to claim 1, further comprising an insulating film formed between the wiring and the third barrier film and having a planarized surface, wherein at least the barrier film is the film stack formed on the insulating film.

* * * * *